US012662728B2

(12) United States Patent
Park

(10) Patent No.: US 12,662,728 B2
(45) Date of Patent: Jun. 23, 2026

(54) MASK ASSEMBLY AND DEPOSITION APPARATUS INCLUDING THE SAME

(71) Applicant: Samsung Display Co., Ltd., Yongin-si (KR)

(72) Inventor: Sangha Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 796 days.

(21) Appl. No.: 17/963,681

(22) Filed: Oct. 11, 2022

(65) Prior Publication Data

US 2023/0203637 A1 Jun. 29, 2023

(30) Foreign Application Priority Data

Dec. 23, 2021 (KR) ........................ 10-2021-0186556

(51) Int. Cl.
| | |
|---|---|
| *C23C 14/04* | (2006.01) |
| *C23C 14/24* | (2006.01) |
| *H10K 71/16* | (2023.01) |
| *H10K 59/12* | (2023.01) |

(52) U.S. Cl.
CPC ............ *C23C 14/042* (2013.01); *C23C 14/24* (2013.01); *H10K 59/12* (2023.02); *H10K 71/166* (2023.02)

(58) Field of Classification Search
CPC ..... C23C 14/042; C23C 14/24; C23C 16/042; C23C 14/04; C23C 14/044; H10K 59/12; H10K 71/166; H10K 59/122; H10K 59/353; H10K 77/10
See application file for complete search history.

(56) References Cited

U.S. PATENT DOCUMENTS

| | | | |
|---|---|---|---|
| 9,997,708 B2 | 6/2018 | Kim et al. | |
| 10,236,475 B2 | 3/2019 | Kim | |
| 2011/0139069 A1* | 6/2011 | Ahn ...................... | H10K 71/166 |
| | | | 257/E33.001 |
| 2014/0137798 A1 | 5/2014 | Ahn et al. | |
| 2015/0013600 A1* | 1/2015 | Hsu ........................ | C23C 14/042 |
| | | | 118/504 |

(Continued)

FOREIGN PATENT DOCUMENTS

| | | |
|---|---|---|
| CN | 110783498 | 2/2020 |
| EP | 3 588 240 | 1/2020 |

(Continued)

OTHER PUBLICATIONS

Extended European Search Report for European Application No. 22215140.9, dated May 19, 2023.

*Primary Examiner* — Aiden Lee
(74) *Attorney, Agent, or Firm* — CANTOR COLBURN LLP

(57) ABSTRACT

A mask assembly includes a frame including a frame opening, a mask disposed on the frame, the mask including a deposition part including main deposition openings overlapping the frame opening, and a non-deposition part adjacent to the deposition part, wherein a coupling opening is formed between the deposition part and the non-deposition part, and a stick including a support part overlapping the non-deposition part and a pattern part overlapping the coupling opening, the pattern part protruding from the support part and including sub deposition openings, wherein the stick is disposed between the mask and the frame.

19 Claims, 20 Drawing Sheets

(56) References Cited

U.S. PATENT DOCUMENTS

| | | | |
|---|---|---|---|
| 2015/0101536 A1 | 4/2015 | Han | |
| 2016/0079532 A1* | 3/2016 | Yi | H10K 71/00 |
| | | | 438/758 |
| 2017/0207390 A1* | 7/2017 | Kim | C23C 14/24 |
| 2017/0222145 A1* | 8/2017 | Kim | H10K 71/00 |
| 2017/0365822 A1* | 12/2017 | Kim | H10K 71/166 |
| 2019/0305222 A1 | 10/2019 | Jung et al. | |
| 2019/0345599 A1 | 11/2019 | Li | |
| 2021/0164087 A1 | 6/2021 | Lin et al. | |
| 2021/0265396 A1 | 8/2021 | Kim et al. | |
| 2021/0359025 A1 | 11/2021 | Jung et al. | |

FOREIGN PATENT DOCUMENTS

| | | |
|---|---|---|
| EP | 3 826 070 | 5/2021 |
| KR | 10-0982021 | 9/2010 |
| KR | 10-2017-0086160 | 7/2017 |
| KR | 10-2020-0028483 | 3/2020 |
| KR | 10-2021-0106616 | 8/2021 |

* cited by examiner

MASK ASSEMBLY AND DEPOSITION APPARATUS INCLUDING THE SAME

CROSS-REFERENCE TO RELATED APPLICATION(S)

This application claims priority to and benefits of Korean Patent Application No. 10-2021-0186556 under 35 U.S.C. § 119, filed on Dec. 23, 2021, in the Korean Intellectual Property Office (KIPO), the entire contents of which are incorporated hereby by reference.

BACKGROUND

1. Technical Field

Embodiments relate to a mask assembly including different types of deposition openings and a deposition apparatus including the mask assembly.

2. Description of the Related Art

A display panel includes a plurality of pixels, each of which includes a driving element such as a transistor and a light emitting element. The pixels may be formed by laminating electrodes and various functional layers on a substrate.

Recently, according to the bezel-less trend, display devices using an existing bezel area as an emission area or other surfaces except for a bottom surface of the display panel as an emission area have been developed.

Thus, the light emitting elements, which are disposed on a main emission area and a sub emission area adjacent to a corner of the main emission area, respectively, may be deposited on different areas. As a result, a technology for a method of manufacturing a mask assembly including deposition openings having different sizes has been developed.

SUMMARY

Embodiments provide a mask assembly including deposition openings having different areas (e.g., shapes or sizes) and a deposition apparatus including the mask assembly.

However, embodiments of the disclosure are not limited to those set forth herein. The above and other embodiments will become more apparent to one of ordinary skill in the art to which the disclosure pertains by referencing the detailed description of the disclosure given below.

In an embodiment, a mask assembly includes: a frame including a frame opening; a mask disposed on the frame, the mask including a deposition part including main deposition openings overlapping the frame opening, and a non-deposition part adjacent to the deposition part, and a coupling opening disposed between the deposition part and the non-deposition part, and; and a stick including a support part overlapping the non-deposition part and a pattern part overlapping the coupling opening, the pattern part protruding from the support part and including sub deposition openings, wherein the stick is disposed between the mask and the frame.

In an embodiment, a surface area of each of the sub deposition openings may be greater than a surface area of each of the main deposition openings.

In an embodiment, a portion of the support part may be removed from an upper surface of the stick toward a lower surface of the stick, a thickness of the removed portion of the support part is equal to or greater than a minimum thickness of the mask, the mask may have a thickness of about 10 μm or more to about 30 μm or less, and the stick may have a thickness of about 40 μm or more to about 150 μm or less.

In an embodiment, an upper surface of the mask and an upper surface of the stick may be coplanar.

In an embodiment, the coupling opening may be adjacent to an edge of the deposition part, and the pattern part and the coupling opening may have a substantially shape each other in a plan view.

In an embodiment, the deposition part may include a short side extending in a first direction, a long side extending from the short side in a second direction intersecting the first direction, and a corner connecting the short side to the long side, the coupling opening may be disposed between the non-deposition part and the long side and between the non-deposition part and the corner, and the pattern part and the coupling opening may have a substantially same shape in a plan view.

In an embodiment, an inner surface of the deposition part forming each of the main deposition openings, may include a first curved surface connected to an upper surface of the deposition part and a second curved surface disposed between the first curved surface and a lower surface of the deposition part.

In an embodiment, an inner surface of the pattern part forming of the sub deposition openings, may include a third curved surface connected to an upper surface of the pattern part and a fourth curved surface disposed between the third curved surface and a lower surface of the pattern part.

In an embodiment, the deposition part may include a short side extending in a first direction, a long side extending from the short side in a second direction intersecting the first direction, and a corner connecting the short side to the long side, and the stick may extend in the first direction and be spaced apart in the second direction to overlap the non-deposition part adjacent to the short side.

In an embodiment, the mask assembly may further include a gap stick disposed between the stick and the frame, extending in the second direction, and spaced apart in the first direction to overlap the non-deposition part adjacent to the long side.

In an embodiment, a first groove, in which the stick is disposed, and a second groove, in which the gap stick is disposed, may be formed in the frame by respectively removing portions of the frame from an upper surface of the frame toward a lower surface of the frame, and the second groove may have a depth that is equal to a sum of a thickness of the stick and a thickness of the gap stick.

In an embodiment, the mask may include an invar, and the stick may be made of stainless steel.

In an embodiment, the mask may include a first alignment hole which does not overlap the stick and is formed by removing at least a portion of the non-deposition part.

In an embodiment, the deposition part may include a short side extending in a first direction, a long side extending from the short side in a second direction intersecting the first direction, and a corner connecting the short side to the long side, and the stick may include a second alignment hole facing a center portion of the short side when viewed in the second direction and is formed by removing at least a portion of the stick from a center of a width of the stick in the second direction.

In an embodiment, the pattern part may include a first pattern part disposed at a side of the support part to overlap the coupling opening and a second pattern part disposed at another side to overlap the non-deposition part, and the non-deposition part may further include an additional coupling opening overlapping the second pattern part.

In an embodiment, the mask may further include a welding protrusion adjacent to the pattern part and disposed on the support part.

In an embodiment, a deposition apparatus may include: a deposition chamber; a mask assembly inside the deposition chamber, the mask assembly including a frame including a frame opening, a mask disposed on the frame, and a stick disposed between the mask and the frame; a deposition substrate disposed on the mask assembly and including a main deposition area and a sub deposition area; and a deposition source configured to eject a deposition material into the frame opening, wherein the mask may include a deposition part including main deposition openings overlapping the main deposition area, a non-deposition part adjacent to the deposition part, and a coupling opening disposed between the deposition part and the non-deposition part, and the stick may include a support part overlapping the non-deposition part and a pattern part disposed in the coupling opening, the pattern part protruding from the support part and including sub deposition openings overlapping the sub deposition area.

In an embodiment, a surface area of each of the sub deposition openings may be greater than a surface of each of the main deposition openings.

In an embodiment, the coupling opening may be adjacent to an edge of the deposition part, and the pattern part and the coupling opening may have a substantially same shape in a plan view.

In an embodiment, the deposition part may include a short side extending in a first direction, a long side extending from the short side in a second direction intersecting the first direction, and a corner connecting the short side to the long side, the coupling opening may be disposed between the non-deposition part and the long side and between the non-deposition part and the corner, and the pattern part and the coupling opening may have a substantially same shape as each other in a plan view.

BRIEF DESCRIPTION OF THE DRAWINGS

The accompanying drawings are included to provide a further understanding embodiments, and are incorporated in and constitute a part of this specification. The drawings illustrate embodiments and, together with the description, serve to explain principles of the invention. In the drawings:

FIG. 5B is a schematic exploded perspective view of the mask assembly according to an embodiment;

FIG. 9A is a schematic coupling perspective view of a mask assembly according to an embodiment;

FIG. 9B is a schematic exploded perspective view of the mask assembly according to an embodiment;

DETAILED DESCRIPTION OF THE EMBODIMENTS

Figure 1:
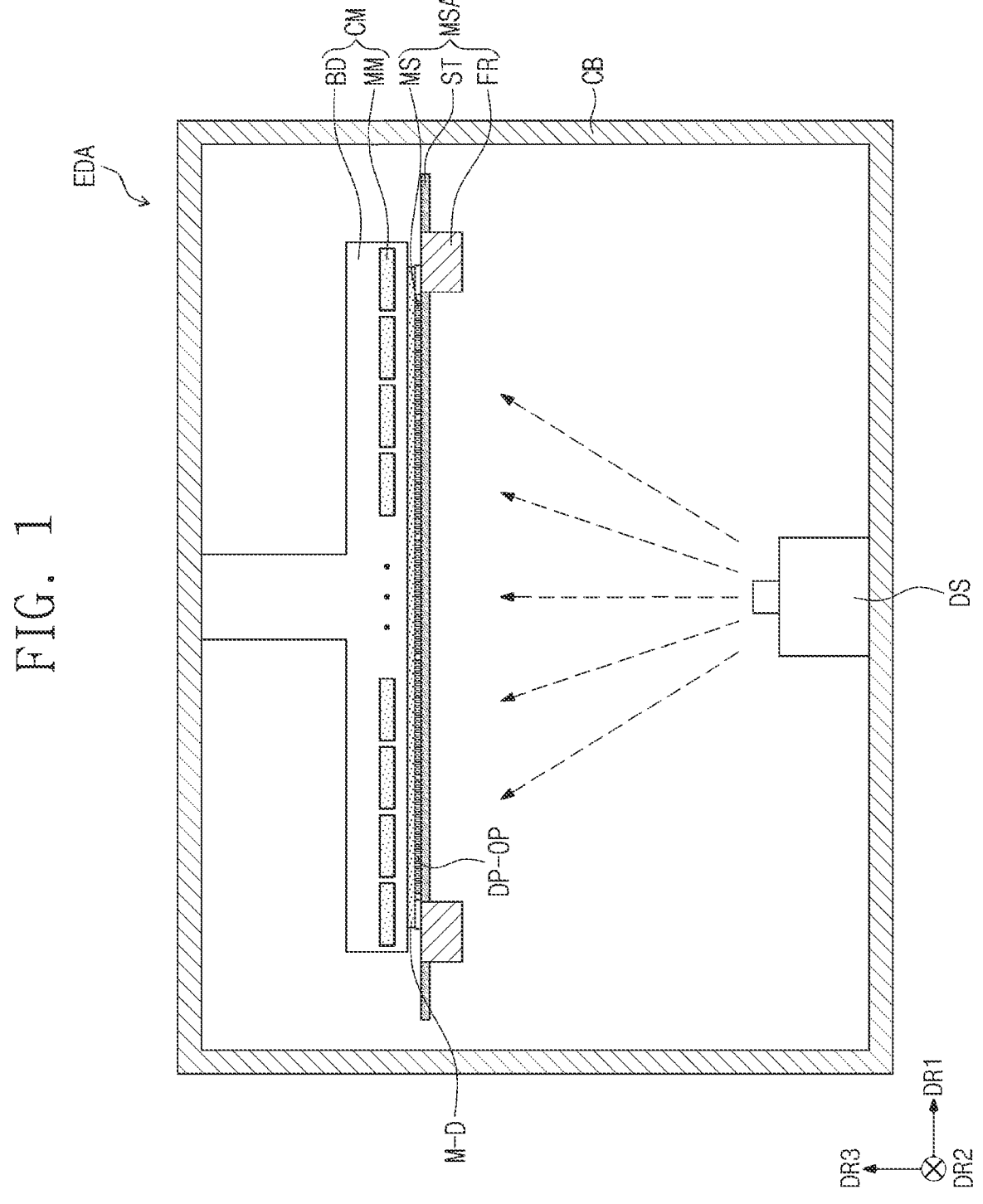
FIG. 1 is a schematic cross-sectional view of a deposition apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

It will also be understood that when one component (or region, layer, portion) is referred to as being 'on', 'connected to', or 'coupled to' another component, it can be directly disposed/connected/coupled on/to the one component, or an intervening third component may also be present. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Like reference numerals refer to like elements throughout. Also, in the figures, the thickness, ratio, and dimensions of components are exaggerated for clarity of illustration. The term "and/or" includes any and all combinations of one or more of the associated components.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of the elements illustrated in the drawings. The terms may be a relative concept and described based on directions expressed in the drawings.

The terminology used herein is for the purpose of describing particular embodiments and is not intended to be limiting. As used herein, the singular forms, "a," "an," and "the" are intended to include the plural forms as well, unless the context clearly indicates otherwise. The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as commonly understood by a person of ordinary skill in the art to which the inventive concept belongs. In addition, terms such as terms defined in commonly used dictionaries should be interpreted as having a meaning consistent with the meaning in the context of the related technology, and unless explicitly defined here, they are interpreted as too ideal or too formal sense. Hereinafter, embodiments will be described with reference to the accompanying drawings.

Figure 2:
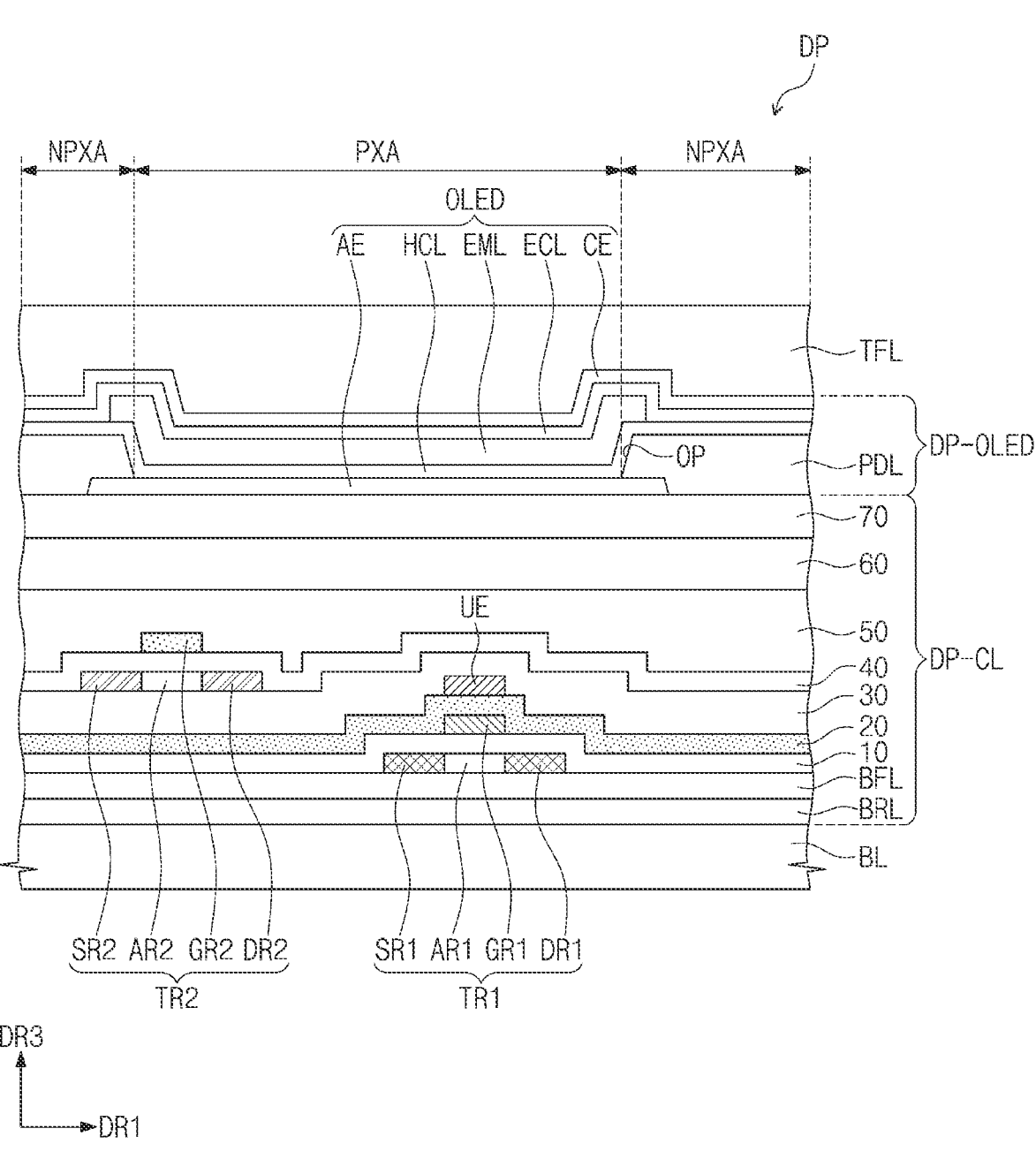
FIG. 2 is a schematic cross-sectional view of a display panel manufactured using a deposition apparatus according to an embodiment.

FIG. 1 is a schematic cross-sectional view of a deposition apparatus according to an embodiment. FIG. 2 is a schematic cross-sectional view of a display panel manufactured using a deposition apparatus according to an embodiment.

Referring to FIG. 1, a deposition apparatus EDA according to an embodiment may include a deposition chamber CB, a fixing member CM, a deposition source DS disposed inside the deposition chamber CB, and a mask assembly MSA disposed inside the deposition chamber CB. For example, the deposition apparatus EDA may further include an additional machine for implementing an in-line system.

The deposition chamber CB may set a deposition condition to a vacuum state. The deposition chamber CB may include a bottom surface (or a lower surface), a ceiling surface, and sidewalls. The bottom surface of the deposition chamber CB may be substantially parallel to a surface defined by a first direction DR1 and a second direction DR2. A third direction DR3 is indicated as a normal direction of the bottom surface of the deposition chamber CB.

The deposition apparatus EDA according to an embodiment may further include a machine for converting the deposition chamber CB to a vacuum state during a deposition process.

The fixing member CM may be disposed inside the deposition chamber CB, may be disposed on the deposition source DS, and may fix (or support) the mask assembly MSA. The fixing member CM may be installed on the ceiling surface of the deposition chamber CB. The fixing member CM may include a jig or a robot arm that holds the mask assembly MSA.

The fixing member CM may include a base part BD and magnetic materials MM coupled to the base part BD. The base part BD may include a plate as a basic structure for fixing the mask assembly MSA, but embodiments are not limited thereto. The magnetic materials MM may be disposed inside or outside the base part BD. The magnetic materials MM may fix (or support) the mask assembly MSA with magnetic force.

The deposition source DS may evaporate a deposition material so as to be ejected (or injected) as deposition vapor. The deposition vapor passes through a frame opening F-OP (see FIG. 5B) formed in a frame FR and is deposited on a deposition substrate M-DP in a pattern (e.g., as predetermined). The deposition substrate M-DP may be defined as a substrate in an intermediate stage of manufacturing a completed display panel DP (see FIG. 3B), which will be described below.

The mask assembly MSA according to an embodiment may include the frame FR, a stick ST, and a mask MS. Main deposition openings DP-OP through which the mask MS passes may be formed in the mask MS.

The mask assembly MSA may be disposed inside the deposition chamber CB, may be disposed on the deposition source DS, and may support the deposition substrate M-DP. The deposition substrate M-DP may include a glass substrate or a plastic substrate. The deposition substrate M-DP may include a polymer layer disposed on the base substrate.

FIG. 2 is a schematic cross-sectional view of the display panel DP manufactured using the deposition apparatus EDA according to an embodiment. The display panel DP may be separated into units (or parts) of panels on the deposition substrate M-DP, which is the parent substrate.

Referring to FIG. 2, the display panel DP may include a base layer BL, a circuit element layer DP-CL disposed on the base layer BL, a display element layer DP-OLED disposed on the circuit element layer DP-CL, and an upper insulating layer TFL disposed on the display element layer DP-OLED.

The base layer BL may include a synthetic resin layer. The synthetic resin layer may be disposed on a support substrate that is used for manufacturing the display panel DP. Thereafter, a conductive layer, an insulating layer, and the like may be disposed on the synthetic resin layer. In case that the support substrate is removed, the synthetic resin layer may be the base layer BL.

The circuit element layer DP-CL may include at least one insulating layer and a circuit element. The circuit element may include the signal line and the driving circuit of the pixel. The circuit element layer DP-CL may be formed through a process of forming an insulating layer, a semiconductor layer, and a conductive layer by coating or deposition and a process of patterning the insulating layer, the semiconductor layer, and the conductive layer by a photolithography process.

In an embodiment, the circuit element layer DP-CL may include a buffer layer BFL, a barrier layer BRL, and first to seventh insulating layers 10 to 70. Each of the buffer layer BFL, the barrier layer BRL, and the first to seventh insulating layers 10 to 70 may include any one of an inorganic layer and an organic layer. Each of the buffer layer BFL and the barrier layer BRL may include an inorganic layer. At least one of the fifth to seventh insulating layers 50 and 70 may include an organic layer.

In FIG. 2, an arrangement of a first active region AR1, a second active region AR2, a first gate region GR1, a second gate region GR2, a first source region SR1, a second source region SR2, a first drain region DR1, a second drain region DR2, which constitute first and second transistors TR1 and TR2, is illustrated.

In an embodiment, the first active region AR1 and the second active region AR2 may include different materials. The first active region AR1 may include a polysilicon semiconductor, and the second active region AR2 may include a metal oxide semiconductor. Each of the first source region SR1 and the first drain region DR1 may be a region having a doping concentration greater than that of the first active region AR1 and has a function of an electrode. Each of the second source region SR2 and the second drain region DR2 may be a region, in which the metal oxide semiconductor is reduced, and has a function of an electrode.

However, structures of the first and second transistors TR1 and TR2 are not limited thereto, and each of the first active region AR1 and the second active region AR2 may include the same semiconductor material. In this case, a laminated structure of the circuit element layer DP-CL may be simplified.

The display element layer DP-OLED may include a pixel defining layer PDL and a light emitting element OLED. The light emitting element OLED may include an organic light emitting diode or a quantum dot light emitting diode. A first electrode AE may be disposed on the seventh insulating layer 70. An opening OP of the pixel defining layer PDL may expose at least a portion of the first electrode AE. An opening OP of the pixel defining layer PDL may define an emission area PXA. The arrangement of the emission area PXA may be related to an arrangement of the first electrode AE. The non-emission area NPXA may surround the emission area PXA.

A hole control layer HCL and an electron control layer ECL may be disposed (e.g., commonly disposed) on the emission area PXA and a non-emission area NPXA. An emission pattern EML may be provided in the form of a pattern to correspond to (e.g., to overlap or face) the opening OP. When compared to the hole control layer HCL and the electron control layer ECL in the form of a film, the emission pattern may be deposited in a different manner.

The hole control layer HCL and the electron control layer ECL may be commonly formed in the pixels by using an open mask. The second electrode CE may be disposed (e.g., commonly disposed) on the emission area PXA and the non-emission area NPXA.

The upper insulating layer TFL may be disposed on the light emitting element OLED. The upper insulating layer TFL may include thin films. The thin films may include an inorganic layer and an organic layer. The upper insulating layer TFL may include an insulating layer for encapsulating the display element layer DP-OLED and an insulating layer for improving light output efficiency.

The deposition apparatus EDA according to an embodiment may be used in a process of depositing the emission pattern EML. The mask assembly MSA according to an embodiment may be used to form the emission pattern EML having various areas. A detailed description will be provided below.

Figure 3A:
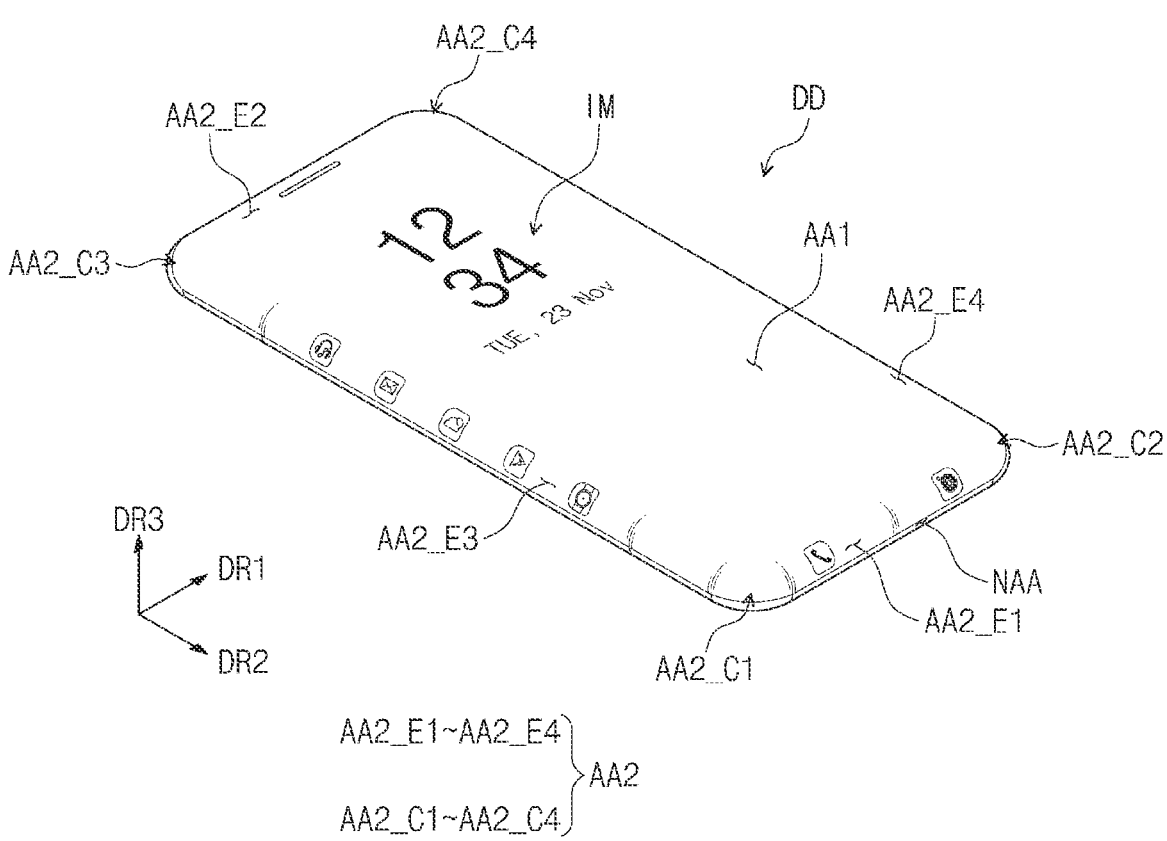
FIG. 3A is a coupling perspective view of a display device according to an embodiment.
Figure 3B:
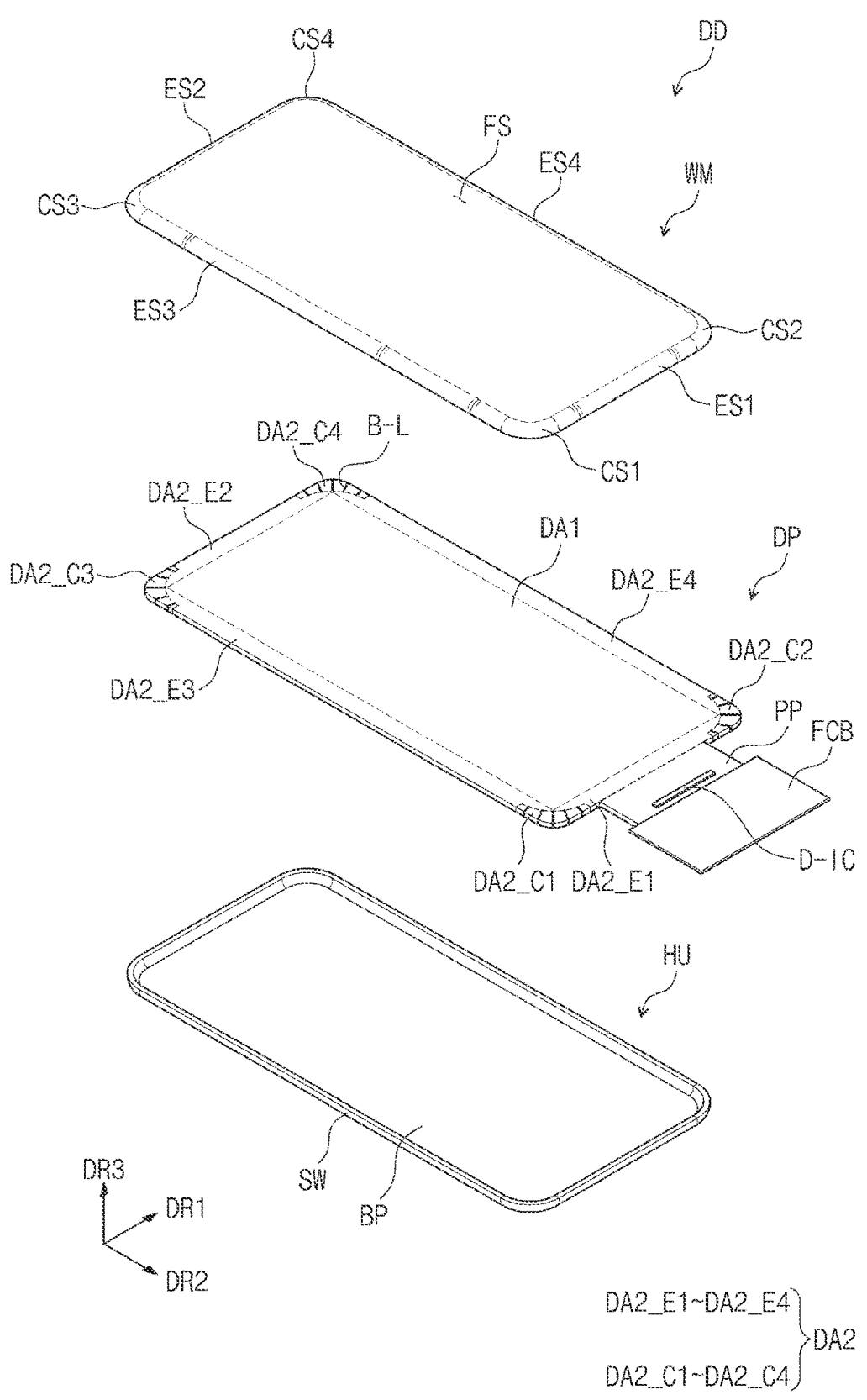
FIG. 3B is a schematic exploded perspective view of the display device according to an embodiment.
Figure 3C:
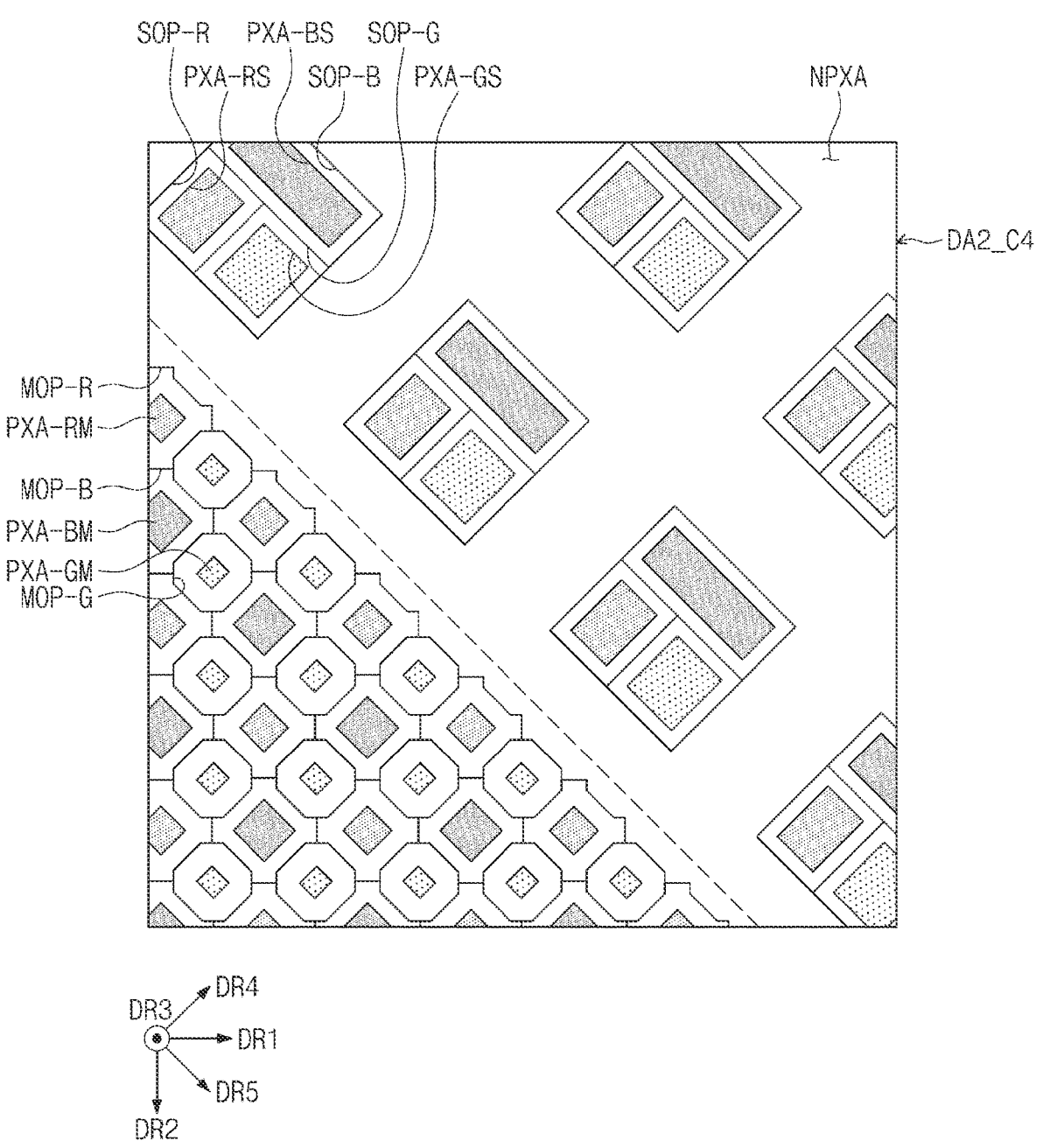
FIG. 3C is a schematic enlarged view of a display area according to an embodiment.

FIG. 3A is a schematic coupling perspective view of a display device according to an embodiment. FIG. 3B is a schematic exploded perspective view of the display device according to an embodiment. FIG. 3C is a schematic enlarged view of a display area according to an embodiment. A display device DD described with reference to FIGS. 3A to 3C may be an electronic device including the display panel DP (see FIG. 2) formed by the deposition apparatus EDA (see FIG. 1) according to an embodiment.

It is illustrated that the display device DD is a smartphone. However, embodiments are not limited thereto. For example, the display device DD may be a large-sized display device such as a television or a monitor, as well as a small and medium-sized display device such as a tablet, a car navigation system, a game console, or a smart watch.

Referring to FIG. 3A, in the display device DD according to an embodiment, an image IM may be displayed on front and side surfaces of the display device DD except for a rear surface. Active areas AA1 and AA2 on which an image IM is displayed and a peripheral area NAA on which the image IM is not displayed may be defined in the display device DD. In FIG. 3A, the image IM is illustrated as a date, a time, and an icon image. However, embodiments are not limited thereto.

The active areas AA1 and AA2 may include a first active area AA1 corresponding to the front surface of the display device DD and having a planar shape in the first direction DR1 and the second direction DR2 and a second active area AA2 corresponding to the side surfaces of the display device DD and bent from the first active area AA1. The second active area AA2 may be an area bent from the first active area AA1 at a curvature (e.g., as predetermined).

The second active area AA2 may be an area that is bent from the first active area AA1. The second active area AA2 may include edge active areas AA2_E1 to AA2_E4 bent from sides of the first active area AA1 and corner active areas AA2_C1 to AA2_C4 bent from corners of the first active area AA1.

The second active area AA2 may include a first edge active area AA2_E1 bent from a first side of the first active area AA1, a second edge active area AA2_E2 bent from a second side of the first active area AA1, a third edge active area AA2_E3 bent from a third side of the first active area AA1, and a fourth edge active area AA2_E4 bent from a fourth side of the first active area AA1.

Each of the first to fourth edge active areas AA2_E1 to AA2_E4 may be bent at a curvature (e.g., as predetermined) in the third direction DR3. Each of the first to fourth edge active areas AA2_E1 to AA2_E4 may have a short curved shape. Although the first to fourth edge active areas AA2_E1 to AA2_E4 are curved to have the same curvature in FIG. 3A, embodiments are not limited thereto. For example, the first and second edge active areas AA2_E1 and AA2_E2 may be bent to have different curvatures from the third and fourth edge active areas AA2_E3 and AA2_E4.

The second active area AA2 further may include a first corner active area AA2_C1 bent from a first corner of the first active area AA1, a second corner active area AA2_C2 bent from a second corner of the first active area AA1, a third corner active area AA2_C3 bent from a third corner of the first active area AA1, and a fourth corner active area AA2_C4 bent from a fourth corner of the first active area AA1.

The first corner active area AA2_C1 may be disposed between the first edge active area AA2_E1 and the third edge active area AA2_E3, and the second corner active area AA2_C2 may be disposed between the first edge active area AA2_E1 and the fourth edge active area AA2_E4. The third corner active area AA2_C3 may be disposed between the second edge active area AA2_E2 and the third edge active area AA2_E3, and the fourth corner active area AA2_C4 may be disposed between the second edge active area AA2_E2 and the fourth edge active area AA2_E4.

Each of the first to fourth corner active areas AA2_C1 to AA2_C4 may be bent at a curvature (e.g., as predetermined)

in the third direction DR3. Each of the first to fourth corner active areas AA2_C1 to AA2_C4 may have a double curved shape.

In the display device DD, the number of edge active areas AA2_E1 to AA2_E4 and the number of corner active areas AA2_C1 to AA2_C4 are not limited thereto. For example, the number of edge active areas AA2_E1 to AA2_E4 and the number of corner active areas AA2_C1 to AA2_C4, which are provided in the second active area AA2, may vary according to the shape of the first active area AA1. Also, in the display device DD, at least one of the edge active areas AA2_E1 to AA2_E4 or the corner active areas AA2_C1 to AA2_C4 may be omitted.

Referring to FIG. 3B, the display device DD may include a window WM, a display panel DP, and a housing HU. The window WM may protect a top surface (or an upper surface) of the display panel DP. The window WM may be optically transparent. Thus, the image displayed on the display panel DP may pass through the window WM and be visually recognized by the user. For example, the display surface of the display device DD may be defined by the window WM. The window WM may be made of glass, plastic, or film.

The window WM may have a curved structure. The window WM may include a front surface FS and one or more curved surfaces bent from the front surface FS. Here, the front surface FS and at least one curved surface may be defined as transmission portions that transmits an image or light. The front surface FS of the window WM may correspond to (e.g., overlap or face) the first active area AA1 of the display device DD, and the at least one or more curved surfaces may define the second active area AA2.

As an example of the disclosure, the window WM may include four curved surfaces, e.g., a first curved surface ES1, a second curved surface ES2, a third curved surface ES3, and a fourth curved surface ES4. In an embodiment, the front surface FS may be a plane defined by the first direction DR1 and the second direction DR2. The front surface FS may be a plane perpendicular to the third direction DR3. Each of the first to fourth curved surfaces ES1 to ES4 is bent from the front surface FS.

The first and second curved surfaces ES1 and ES2 may be bent from first and second sides of the front surface FS, respectively. The first and second sides of the front surface FS may be parallel to the first direction DR1. The first curved surface ES1 and the second curved surface ES2 may be disposed in parallel to each other in the first direction DR1. Each of the third curved surface ES3 and the fourth curved surface ES4 is bent from the front surface FS. For example, the third and fourth curved surfaces ES3 and ES4 may be bent from the third and fourth sides of the front surface FS, respectively. The third and fourth sides of the front surface FS may be parallel to the second direction DR2. The third curved surface ES3 and the fourth curved surface ES4 may be disposed in parallel to each other in the second direction DR2.

Each of the first to fourth curved surfaces ES1 to ES4 may be bent from the front surface FS at a curvature (e.g., as predetermined). As an example of the disclosure, the first to fourth curved surfaces ES1 to ES4 may have the same curvature. As another example, the first and second curved surfaces ES1 and ES2 may have the same curvature, and the third and fourth curved surfaces ES3 and ES4 may have the same curvature. However, the first and second curved surfaces ES1 and ES2 may have different curvatures from the third and fourth curved surfaces ES3 and ES4.

The window WM may further include at least one corner. As an example, the window WM may further include four corners, e.g., a first corner CS1, a second corner CS2, a third corner CS3, and a fourth corner CS4. Each of the first to fourth corners CS1 to CS4 may have at least two or more curvatures. Each of the first to fourth corners CS1 to CS4 may have a shape in which curved surfaces having different curvatures are continuously connected to each other. Each of the first to fourth corners CS1 to CS4 may be defined as a transmission part that transmits an image or light.

The display panel DP may include a display area for displaying an image. As an example of the disclosure, the display area may include a first display area DA1 and a second display area DA2. The first display area DA1 may be disposed in parallel to the front surface FS of the window WM and may have a shape corresponding to the front surface FS. For example, the first display area DA1 may be a planar display area having a planar shape.

The second display area DA2 may be disposed to correspond to (e.g., overlap or face) one or more curved surfaces and one or more corners. The second display area DA2 may have a curved shape corresponding to at least one curved surface and at least one corner. However, the shape of the second display area DA2 is not limited thereto, and the second display area DA2 may also be vertically bent from the first display area DA1 to have a planar shape.

The second display area DA2 may include first to fourth edge display areas DA2_E1 to DA2_E4 that are disposed to correspond to (e.g., overlap or face) the first to fourth curved surfaces ES1 to ES4, respectively. The first and second edge display areas DA2_E1 and DA2_E2 may be bent from the first and second sides of the first display area DA1 and disposed to correspond to the first and second curved surfaces ES1 and ES2 of the window WM, respectively. The first and second sides of the first display area DA1 extend parallel to the first direction DR1. Each of the first and second edge display areas DA2_E1 and DA2_E2 may have a curvature (e.g., as predetermined) and be bent from the first display area DA1.

The third and fourth edge display areas DA2_E3 and DA2_E4 may be bent from the third and fourth sides of the first display area DA1 and may be disposed to correspond to the third and fourth curved surfaces ES3 and ES4 of the window WM, respectively. The third and fourth sides of the first display area DA1 extend parallel to the second direction DR2. Each of the third and fourth edge display areas DA2_E3 and DA2_E4 may have a curvature (e.g., as predetermined) and may be bent from the first display area DA1.

Although the structure in which the second display area DA2 includes four edge display areas DA2_E1 to DA2_E4 in the display panel DP according to an embodiment has been described above, the structure of the display panel DP according to an embodiment is not limited thereto. For example, the second display area DA2 of the display panel DP may include a single edge display area or may two edge display areas provided at the first and second sides of the first display area DA1 or provided at the third and fourth sides of the first display area DA1.

The second display area DA2 may further include first to fourth corner display areas DA2_C1 to DA2_C4, which are disposed to correspond to the first to fourth corners CS1 to CS4 of the window WM, respectively. The first corner display area DA2_C1 may be disposed between the first and third edge display areas DA2_E1 and DA2_E3, and the second corner display area DA2_C2 may be disposed between the first and fourth edge display areas DA2_E1 and DA2_E4 Also, the third corner display area DA2_C3 may be disposed between the second and third edge display areas DA2_E2 and DA2_E3, and the fourth corner display area DA2_C4 may be disposed between the second and fourth edge display areas DA2_E2 and DA2_E4. The first to fourth corner display areas DA2_C1 to DA2_C4 may be areas on which an image is substantially displayed.

However, embodiments are not limited thereto. For example, for another example, the first to fourth corner display areas DA2_C1 to DA2_C4 may be areas that do not display an image, and only some of the first to fourth corner display areas DA2_C1 to DA2_C4 may display an image.

According to an embodiment, each of the first to fourth corner display areas DA2_C1 to DA2_C4 may include cutoff lines B-L to improve bending characteristics of the first to fourth corner display areas DA2_C1 to DA2_C4 having a double curved surface. A portion of the cutoff lines B-L, which overlaps the first to fourth corner display areas DA2_C1 to DA2_C4 of the display panel DP, may be cut to be defined as an empty space. Thus, in case that the first to fourth corner display areas DA2_C1 to DA2_C4 are disposed between the first to fourth edge display areas DA2_E1 to DA2_E4 corresponding thereto so as to be bent with a double curvature, the first display area DA may be readily bent by the cutoff lines B-L.

The display panel DP according to an embodiment may further include a non-display area around the second display area DA2. The non-display area is an area on which an image is not substantially displayed. The non-display area may surround the second display area DA2.

According to an embodiment, the second display area DA2 may be an area that overlaps a driving element (e.g., a scan driver, etc.) for driving the pixels disposed on the first display area DA1 and the second display area DA2 and circuit lines. Thus, quality of the pixels disposed on the second display area DA2 may be reduced when compared to quality of the pixels disposed on the first display area DA1. Also, in an area of the emission pattern, which provided in each of the pixels, an area of the emission pattern disposed on the first display area DA1 and an area of the emission pattern disposed on the second display area DA2 may be different from each other.

The display panel DP may further include a pad area PP extending from the second display area DA2. A driving chip D-IC and pads may be disposed on the pad area PP of the display panel DP. The driving chip D-IC may include a data driver for driving the pixel. The driving chip D-IC in which the data driver is embedded may provide data signals to the first and second display areas DA1 and DA2 of the display panel DP. The driving chip D-IC may further include a driving voltage generator, an initialization voltage generator, and the like. For example, the driving chip D-IC may supply first and second driving voltages and an initialization voltage to the first and second display areas DA1 and DA2.

As an example of the disclosure, the driving chip D-IC may be mounted on the display panel DP. The display panel DP may be electrically connected to a flexible circuit film FCB through the pads. In an embodiment, the driving chip D-IC may be mounted on the flexible circuit film FCB.

The housing HU may include a bottom part BP and a sidewall SW. The sidewall SW may extend from the bottom part BP. The housing HU may accommodate the display panel DP in an accommodation space defined by the bottom part BP and the sidewall SW. The window WM may be coupled to the sidewall SW of the housing HU. The sidewall SW of the housing may support an edge of the window WM.

The housing HU may include a material having relatively high rigidity. For example, the housing HU may include glass, plastic, or a metal or may include frames and/or plates made of a combination of glass, plastic, and a metal. The housing HU may stably protect constituents (e.g., parts or elements) of the display device DD accommodated in the internal space from external impact.

FIG. 3A is a schematic coupling perspective view illustrating the first display area DA1 and the fourth corner display area DA2_C4 of the display device DD. The description with respect to the fourth corner display area DA2_C4 may be also applied to the first to third corner display areas DA2_C1 to DA2_C3 provided in the second display area DA2.

According to an embodiment, the first display area DA1 may include a first-1 main emission area PXA-RM overlapping a first-1 main opening MOP-R, a first-2 main emission area PXA-GM overlapping a first-2 main opening MOP-G, and a first-3 main emission area PXA-BM overlapping a first-3 main opening MOP-B.

The fourth corner display area DA2_C4 of the second display area DA2 may include a second-1 sub emission area PXA-RS overlapping a second-1 sub opening SOP-R, a second-2 sub emission area PXA-GS overlapping a second-2 sub opening SOP-G, and a second-3 sub emission area PXA-BS overlapping a second-3 sub opening SOP-B.

Each of the main openings MOP-R, MOP-G, and MOP-B and the sub openings SOP-R, SOP-G, and SOP-B may correspond to (e.g., overlap or face) the opening OP of the pixel defining layer PDL, which has been described in FIG. 2, and each of the main emission areas PXA-RM, PXA-GM, and PXA-BM and the sub emission areas PXA-RS, PXA-GS, and PXA-BS may correspond to (e.g., overlap or face) the emission area PXA, which has been described in FIG. 2.

According to an embodiment, the first-1 main emission area PXA-RM may be spaced apart from the first-2 main emission area PXA-GM in a fifth direction DR5, and the first-3 main emission area PXA-GM may be spaced apart from the first-1 main emission area PXA-RM in the second direction DR2. The first-3 main emission areas PXA-BM may be spaced apart from the first-2 main emission areas PXA-GM in the fourth direction DR4.

In an embodiment, the first-1 main emission area PXA-RM may provide (or emit) red light, the first-2 main emission area PXA-GM may provide (or emit) green light, and the first-3 main emission area PXA-BM may provide (or emit) blue light.

Surface areas of the main emission areas PXA-RM, PXA-GM, and PXA-BM according to an embodiment may be different from each other. For example, a surface area (or surface size) of the first-1 main emission area PXA-RM may be larger than that of the first-2 main light emission area PXA-GM and may be less than that of the first-3 main emission area PXA-BM.

According to an embodiment, each of the first-1 main emission area PXA-RM and the first-3 main emission area PXA-BM may have a rectangular shape, and the first-2 main emission area PXA-GM may have a polygonal shape. The arrangement, surface area, and shape of each of the main emission areas PXA-RM, PXA-GM, and PXA-BM may be changed according to the quality of the display panel DP, but embodiments are not limited thereto.

In an embodiment, each of the second-1 sub emission area PXA-RS and the second-2 sub emission area PXA-GS may have a rectangular shape extending in the fourth direction DR4, and the second-3 sub emission area PXA-BS may have a rectangular shape extending in the fifth direction DR5.

In an embodiment, the second-1 sub emission area PXA-RS may provide (or emit) red light, the second-2 sub emission area PXA-GS may provide (or emit) green light, and the second-3 sub emission area PXA-BS may provide (or emit) blue light.

Each of the second-1 sub emission area PXA-RS and the second-2 sub emission area PXA-GS may be spaced apart from the second-3 sub emission area PXA-BS in the fourth direction DR4, and the second-1 sub emission area PXA-RS and second-2 sub emission area PXA-GS may be spaced apart from each other in the fifth direction DR5.

Surface areas of the sub emission areas PXA-RS, PXA-GS, and PXA-BS according to an embodiment may be different from each other. For example, the surface area of the second-third sub emission area PXA-BS may be the largest among the sub emission areas PXA-RS, PXA-GS, and PXA-BS. The arrangement, surface area, and shape of each of the sub emission areas PXA-RS, PXA-GS, and PXA-BS may be changed according to the quality of the display panel DP, but embodiments are not limited thereto.

Figure 5A:
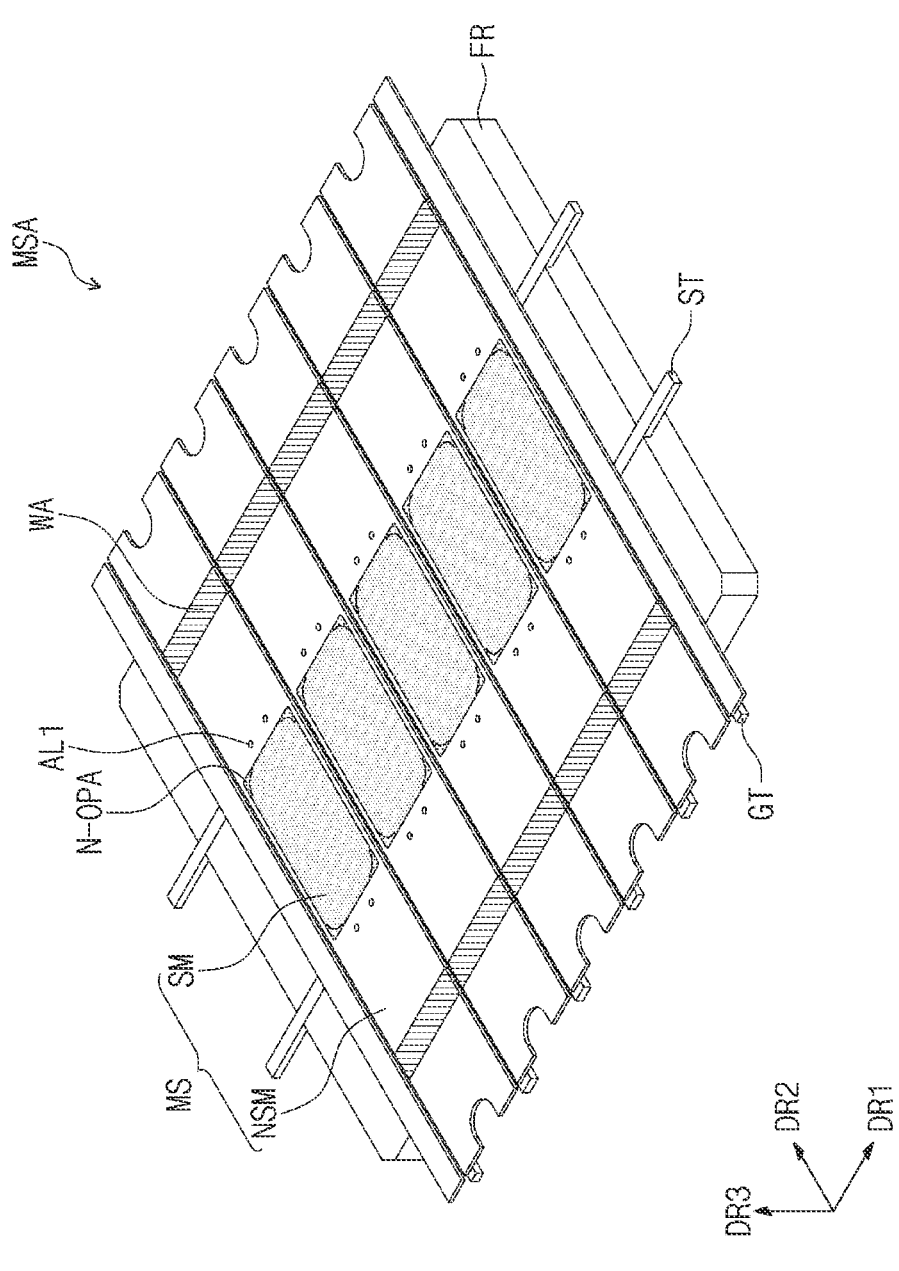
FIG. 5A is a schematic coupling perspective view of a mask assembly according to an embodiment.

In the disclosure, the shape and surface area of each of the main emission areas PXA-RM, PXA-GM, and PXA-BM and the sub emission areas PXA-RS, PXA-GS, and PXA-BS may correspond to those of the emission patterns deposited through the mask assembly MSA (see FIG. 5A).

According to an embodiment, the surface areas of the emission areas providing light having the same color on the first display area DA1 and the second display area DA2 may be different from each other. Thus, the surface areas of the emission patterns EML (see FIG. 2) patterned in the corresponding openings in the first display area DA1 and the second display area DA2 are also different, and in order to pattern the emission patterns having different areas, a mask assembly including deposition openings having different areas (e.g., shapes or sizes) are required.

Figure 4A:
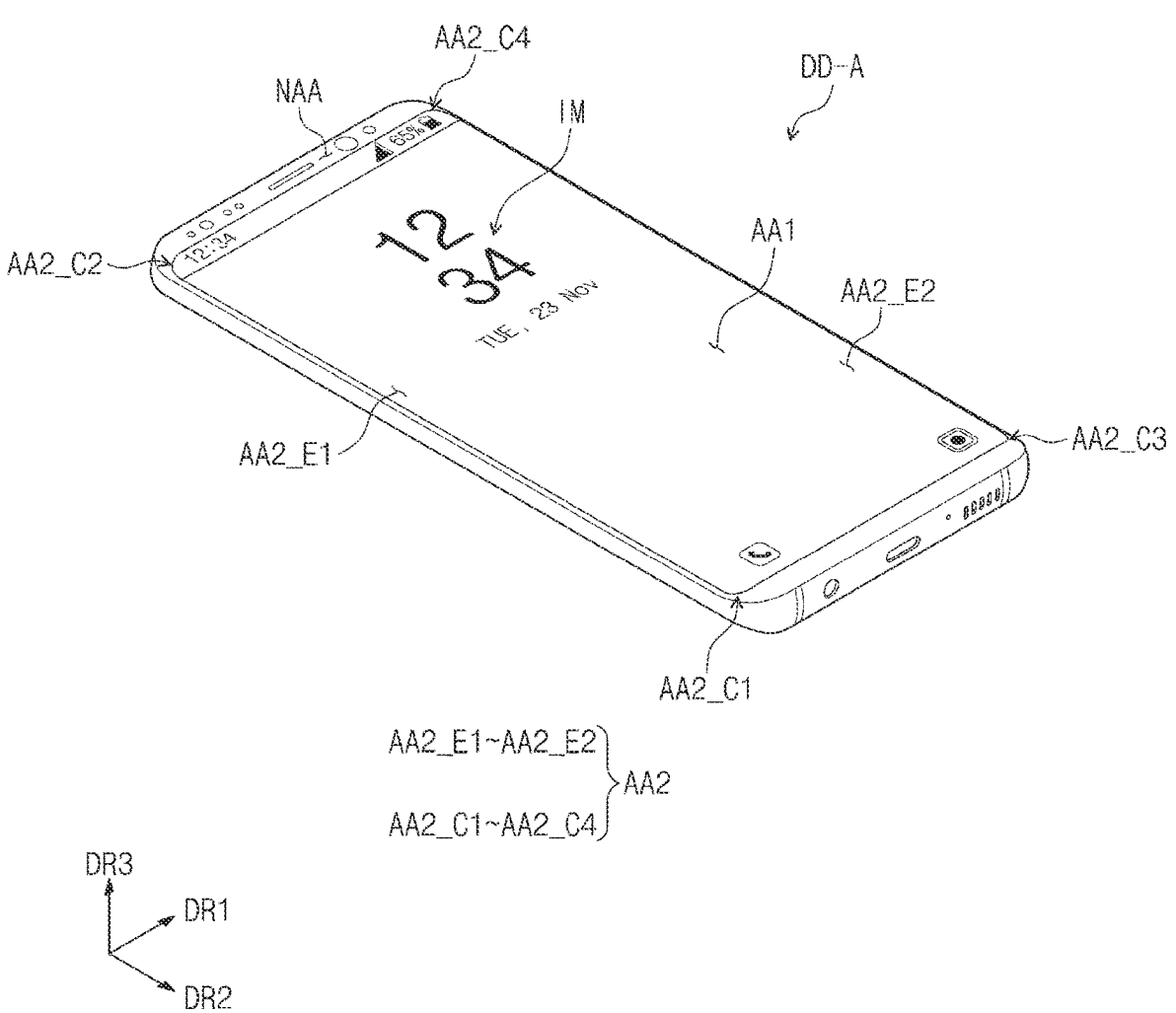
FIG. 4A is a schematic coupling perspective view of a display device according to an embodiment.
Figure 4B:
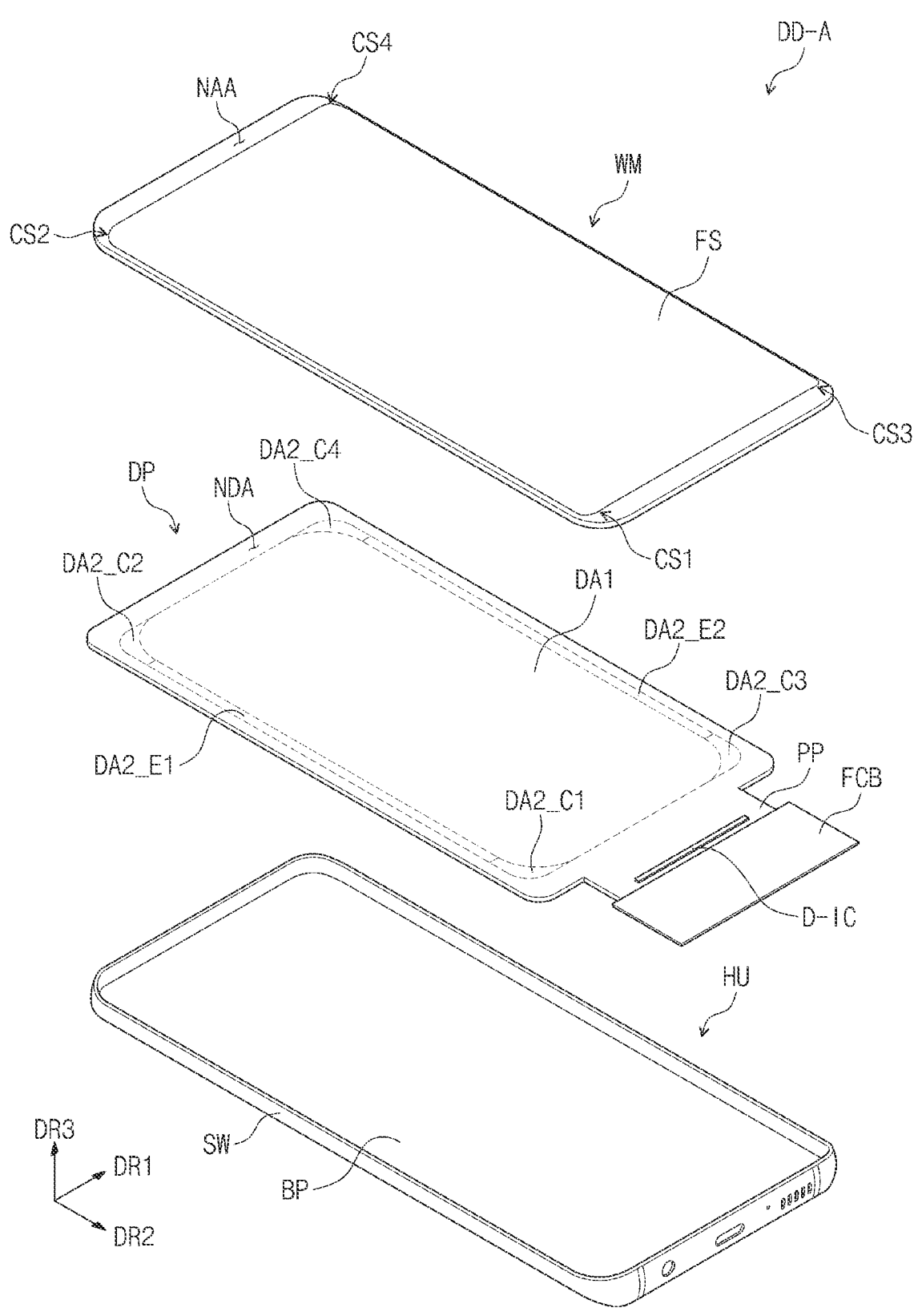
FIG. 4B is a schematic exploded perspective view of the display device according to an embodiment.
Figure 4C:
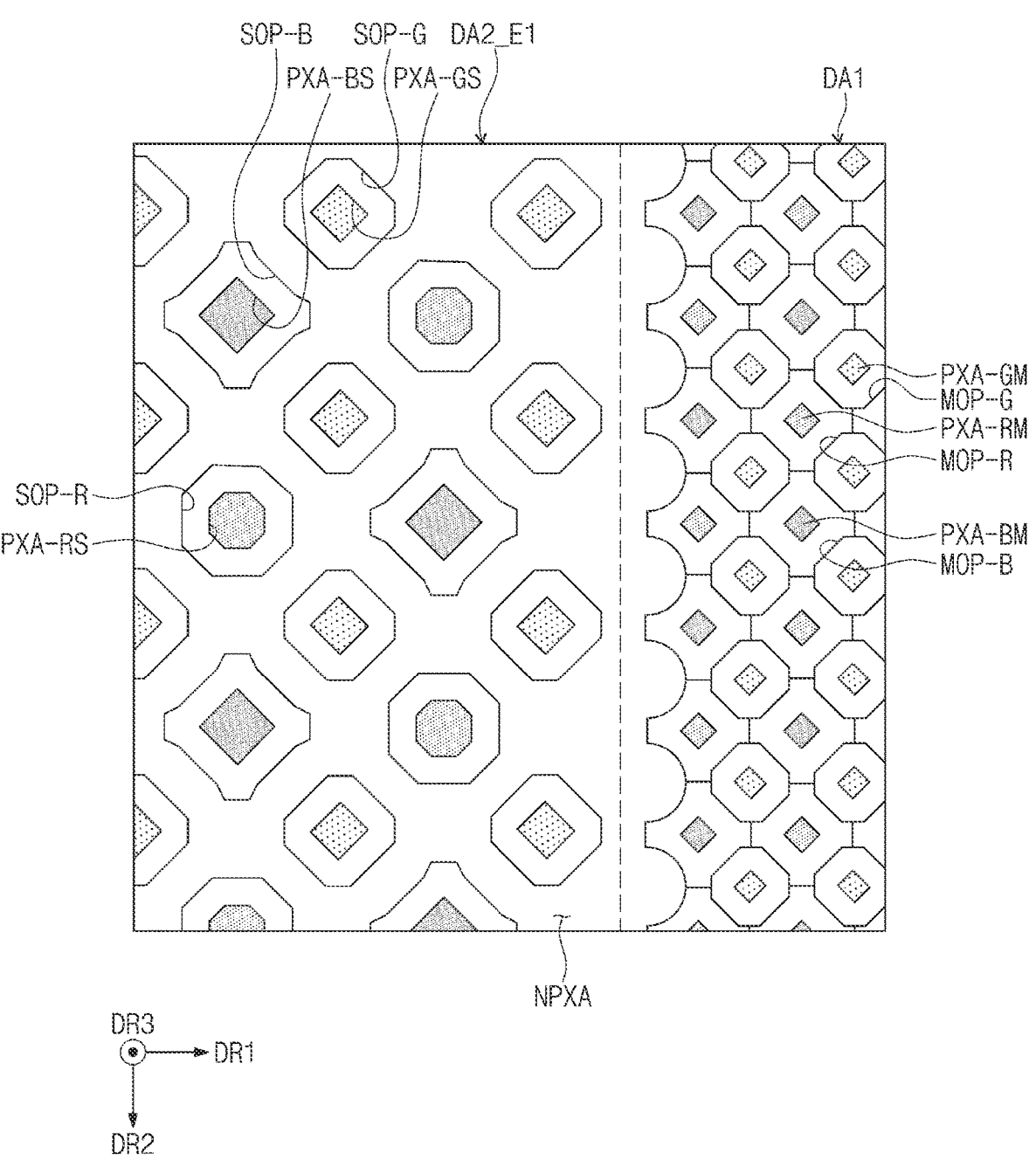
FIG. 4C is a schematic enlarged view of a display area according to an embodiment.

FIG. 4A is a schematic coupling perspective view of a display device according to an embodiment. FIG. 4B is a schematic exploded perspective view of the display device according to an embodiment. FIG. 4C is a schematic enlarged view of a display area according to an embodiment. The same/similar reference numerals are used for the same/similar configurations as the configurations described in FIGS. 1 to 3C, and redundant descriptions are omitted for descriptive convenience.

Referring to FIG. 4A, active areas AA1 and AA2 on which an image IM may be displayed and a peripheral area NAA on which the image IM is not displayed may be defined on a display device DD-A. In FIG. 4A, the image IM is illustrated as a date, a time, and an icon image.

In an embodiment, the first active area AA1 may include a first active area AA1 having a planar shape in the first direction DR1 and the second direction DR2 and a second active area AA2 extending from the first active area AA1.

The second active area AA2 may include edge active areas AA2_E1 and AA2_E2 bent from sides of the first active area AA1 and corner active areas AA2_C1 to AA2_C4 bent from corners of the first active area AA1.

The second active area AA2 may include a first edge active area AA2_E1 bent from a first side of the first active area AA1 and a second edge active area AA2_E2 bent from a second side of the first active area AA1.

The second active area AA2 may include a first corner active area AA2_C1 bent from a first corner of the first active area AA1, a second corner active area AA2_C2 bent from a second corner of the first active area AA1, a third corner active area AA2_C3 bent from a third corner of the first active area AA1, and a fourth corner active area AA2_C4 bent from a fourth corner of the first active area AA1.

The first corner active area AA2_C1 may be disposed at an end of the first edge active area AA2_E1, and the second corner active area AA2_C2 may be disposed at another end of the first edge active area AA2_E1. The third corner active area AA2_C3 may be disposed at an end of the second edge active area AA2_E2, and the fourth corner active area AA2_C4 may be disposed at another end of the second edge active area AA2_E2.

Each of the first and second edge active areas AA2_E1 and AA2_E2 may be bent at a curvature (e.g., as predetermined) in the third direction DR3. Each of the first and second edge active areas AA2_E1 and AA2_E2 may have a short curved shape. Also, each of the first to fourth corner active areas AA2_C1 to AA2_C4 may be bent at a curvature (e.g., as predetermined) in the third direction DR3. Each of the first to fourth corner active areas AA2_C1 to AA2_C4 may have a double curved shape. However, embodiments are not limited thereto, and the second active area AA2 may define the same plane as the first active area AA1.

Referring to FIG. 4B, the display device DD-A may include a window WM, a display panel DP, and a housing HU. The description with respect to the window WM, the pad area PP of the display panel DP, the driving chip D-IC, the flexible circuit film FCB, and the housing HU may correspond to the descriptions of the pad area PP, the driving chip D-IC, the flexible circuit film FCB, and the housing HU of the display panel DP described with reference to FIGS. 3A and 3B. Thus, a first display area DA1 and a second display area DA2 provided in the display panel DP will be described for descriptive convenience.

The window WM may have a curved structure. The window WM may include a front surface FS and one or more curved surfaces bent from the front surface. Here, the front surface FS and at least one curved surface may be defined as transmission portions that transmits an image or light. The front surface FS of the window WM may define the first active area AA1 of the display device DD, and the at least one curved surface may define the second active area AA2. However, embodiments are not limited thereto, and the curved surface of the window WM may be omitted. For example, the second active area AA2 may define the same plane as the first active area AA1.

The window WM may further include at least one corner. As an example, the window WM may further include four corners, e.g., a first corner CS1, a second corner CS2, a third corner CS3, and a fourth corner CS4.

In case that the window WM may include a curved surface, each of the first to fourth corners CS1 to CS4 may have at least two or more curvatures. Each of the first to fourth corners CS1 to CS4 may have a shape in which curved surfaces having different curvatures are connected to (e.g., continuously connected to) each other. Each of the first to fourth corners CS1 to CS4 may be defined as a transmission part that transmits an image or light.

In an embodiment, the window WM may define a peripheral area NAA on which the image IM is not displayed. The peripheral area NAA may be defined as an area other than the first display area DA1 and the second display area DA2, which provide (or display) an image in the display panel DP.

The display panel DP may include a display area for displaying an image. As an example of the disclosure, the display area may include a first display area DA1 and a second display area DA2. The first display area DA1 may be disposed in parallel to the front surface FS of the window WM and may have a shape corresponding to the front surface FS. For example, the first display area DA1 may be a planar display area having a planar shape.

The second display area DA2 may be disposed to correspond to (e.g., overlap or face) one or more curved surfaces and one or more corners. The second display area DA2 may have a curved shape corresponding to at least one curved surface and at least one corner. However, the shape of the second display area DA2 is not limited thereto, and the second display area DA2 may define the same plane as the first display area DA1.

In case that the second active area AA2 may include the curved surface, the second display area DA2 may include first and second edge display areas DA2_E1 and DA2_E2. The first and second edge display areas DA2_E1 and DA2_E2 may extend in the first direction DR1 from first and second sides of the first display area DA1, and each of the first and second edge display areas DA2_E1 and DA2_E2 may extend in the second direction DR2. Each of the first and second edge display areas DA2_E1 and DA2_E2 may have a curvature (e.g., as predetermined) and be bent from the first display area DA1.

Although the structure in which the second display area DA2 includes two edge display areas DA2_E1 and DA2_E2 in the display panel DP according to an embodiment has been described above, the structure of the display panel DP according to an embodiment is not limited thereto. For example, the second display area DA2 of the display panel DP may include a single edge display area.

The second display area DA2 may further include first to fourth corner display areas DA2_C1 to DA2_C4, which are disposed to correspond (e.g., overlap or face) to the first to fourth corners CS1 to CS4 of the window WM, respectively. The first corner display area DA2_C1 may be disposed between the first and third edge display areas DA2_E1 and DA2_E3, and the second corner display area DA2_C2 may be disposed between the first and fourth edge display areas DA2_E1 and DA2_E4. Also, the third corner display area DA2_C3 may be disposed between the second and third edge display areas DA2_E2 and DA2_E3, and the fourth corner display area DA2_C4 may be disposed between the second and fourth edge display areas DA2_E2 and DA2_E4. The first to fourth corner display areas DA2_C1 to DA2_C4 may be areas on which an image is substantially displayed.

The display panel DP may further include a non-display area NDA around the second display area DA2. The non-display area NDA is an area on which an image is not substantially displayed. The non-display area NDA may surround the second display area DA2.

In an embodiment, a surface area of the non-display area NDA adjacent to the second display area DA2 may be reduced. For example, the second display area DA2 may be an area that overlaps a driving element (e.g., a scan driver, etc.) for driving the pixels disposed on the first display area DA1 and the second display area DA2 and circuit lines and also may function as a display area that provides (or emits) light. Thus, an image may be provided to an area overlapping the second display area DA2 of the window WM.

According to an embodiment, a width of the peripheral area NAA adjacent to the second display area DA2 of the peripheral areas NAA defined on the window WM may be reduced when compared to a width of the remaining peripheral areas NAA.

As driving elements (e.g., scan drivers, etc.) for driving pixels disposed on the first display area DA1 and the second display area DA2 and circuit lines are densely disposed on the second display area DA2, quality of the pixels disposed on the second display area DA2 may be reduced when compared to quality of the pixels disposed on the first display area DA1, and a surface area of an emission pattern provided in each of the pixels and a surface area of an emission pattern disposed on the first display area DA1 may also be different from each other.

FIG. 4C is a schematic enlarged view of a first display area DA1 and a first edge display area DA2_E1 of the display panel DP according to an embodiment. The descriptions with respect to the first edge display area DA2_E1 may be also applied to the first and second edge display areas DA2_E1 and DA2_E2 and the first to fourth corner display areas DA2_C1 to DA2_C4 provided in the second display area DA2.

According to an embodiment, the first display area DA1 may include a first-1 main emission area PXA-RM overlapping a first-1 main opening MOP-R, a first-2 main emission area PXA-GM overlapping a first-2 main opening MOP-G, and a first-3 main emission area PXA-BM overlapping a first-3 main opening MOP-B.

The first edge display area DA2_E1 of the second display area DA2 may include a second-1 sub emission area PXA-RS overlapping (or facing) a second-1 sub opening SOP-R, a second-2 sub emission area PXA-GS overlapping (or facing) a second-2 sub opening SOP-G, and a second-3 sub emission area PXA-BS overlapping (or facing) a second-3 sub opening SOP-B.

Each of the main openings MOP-R, MOP-G, and MOP-B and the sub openings SOP-R, SOP-G, and SOP-B may correspond to (e.g., overlap or face) the opening OP of the pixel defining layer PDL, which has been described in FIG. 2, and each of the main emission areas PXA-RM, PXA-GM, and PXA-BM and the sub emission areas PXA-RS, PXA-GS, and PXA-BS may correspond to (e.g., overlap or face) the emission area PXA, which has been described in FIG. 2.

According to an embodiment, the first-1 main emission area PXA-RM may be alternately spaced apart from the first-3 main emission areas PXA-BM in the second direction DR2. The first-2 main emission areas PXA-GM may be arranged to be spaced apart from each other in the second direction DR2, and each of the first-2 main emission areas PXA-GM may be spaced apart from the first-1 main emission area PXA-RM and the first-3 main emission area RXA-BM in an oblique direction.

In an embodiment, the first-1 main emission area PXA-RM may provide (or emit) red light, the first-2 main emission area PXA-GM may provide (or emit) green light, and the first-3 main emission area PXA-BM may provide (or emit) blue light.

Surface areas and shapes of the main emission areas PXA-RM, PXA-GM, and PXA-BM according to an embodiment may be different from each other. However, embodiments are not limited thereto, and the arrangement, surface area, and shape of each of the main emission areas PXA-RM, PXA-GM, and PXA-BM may be changed according to the quality of the display panel DP, but embodiments are not limited thereto.

In an embodiment, the second-1 sub emission area PXA-RS may be alternately spaced apart from the second-3 sub emission area PXA-BS in the second direction DR2. The second-2 sub emission areas PXA-GS may be arranged to be spaced apart from each other in the second direction DR2, and each of the second-2 sub emission areas PXA-GS may be spaced apart from the second-1 sub emission area PXA-RS and the second-3 sub emission area PXA-BS in an oblique direction.

In an embodiment, the second-1 sub emission area PXA-RS may provide (or emit) red light, the second-2 sub emission area PXA-GS may provide (or emit) green light, and the second-3 sub emission area PXA-BS may provide (or emit) blue light.

Surface areas of the sub emission areas PXA-RS, PXA-GS, and PXA-BS according to an embodiment may be different from each other. For example, a surface area (or surface size) of the second-1 sub emission area PXA-RS may be less than that of the second-3 sub emission area PXA-BS and may be greater than that of the second-2 sub emission area PXA-GS. However, the arrangement, surface area, and shape of each of the sub emission areas PXA-RS, PXA-GS, and PXA-BS may be changed according to the quality of the display panel DP, but embodiments are not limited thereto.

Figure 9A:
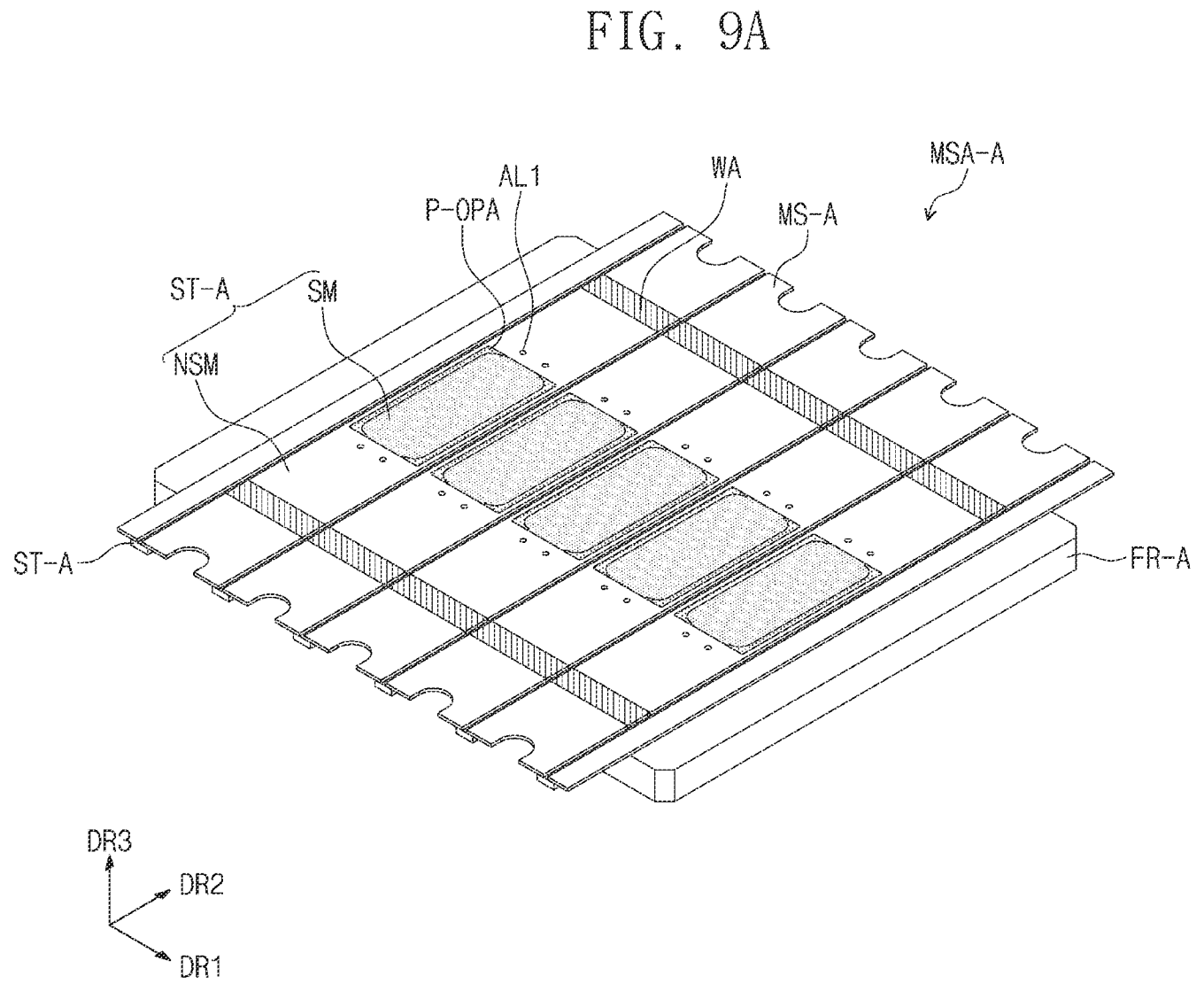

In the disclosure, the shape and surface area of each of the main emission areas PXA-RM, PXA-GM, and PXA-BM and the sub emission areas PXA-RS, PXA-GS, and PXA-BS may correspond to (e.g., overlap or face) those of the emission patterns deposited through the mask assembly MSA-A (see FIG. 9A).

According to an embodiment, the surface areas of the emission areas providing light having the same color on the first display area DA1 and the second display area DA2 may be different from each other. Thus, the surface areas of the emission patterns EML (see FIG. 2) patterned in the corresponding openings in the first display area DA1 and the second display area DA2 are also different, and in order to pattern the emission patterns having different areas, a mask assembly including deposition openings having different areas are required.

Figure 5B:
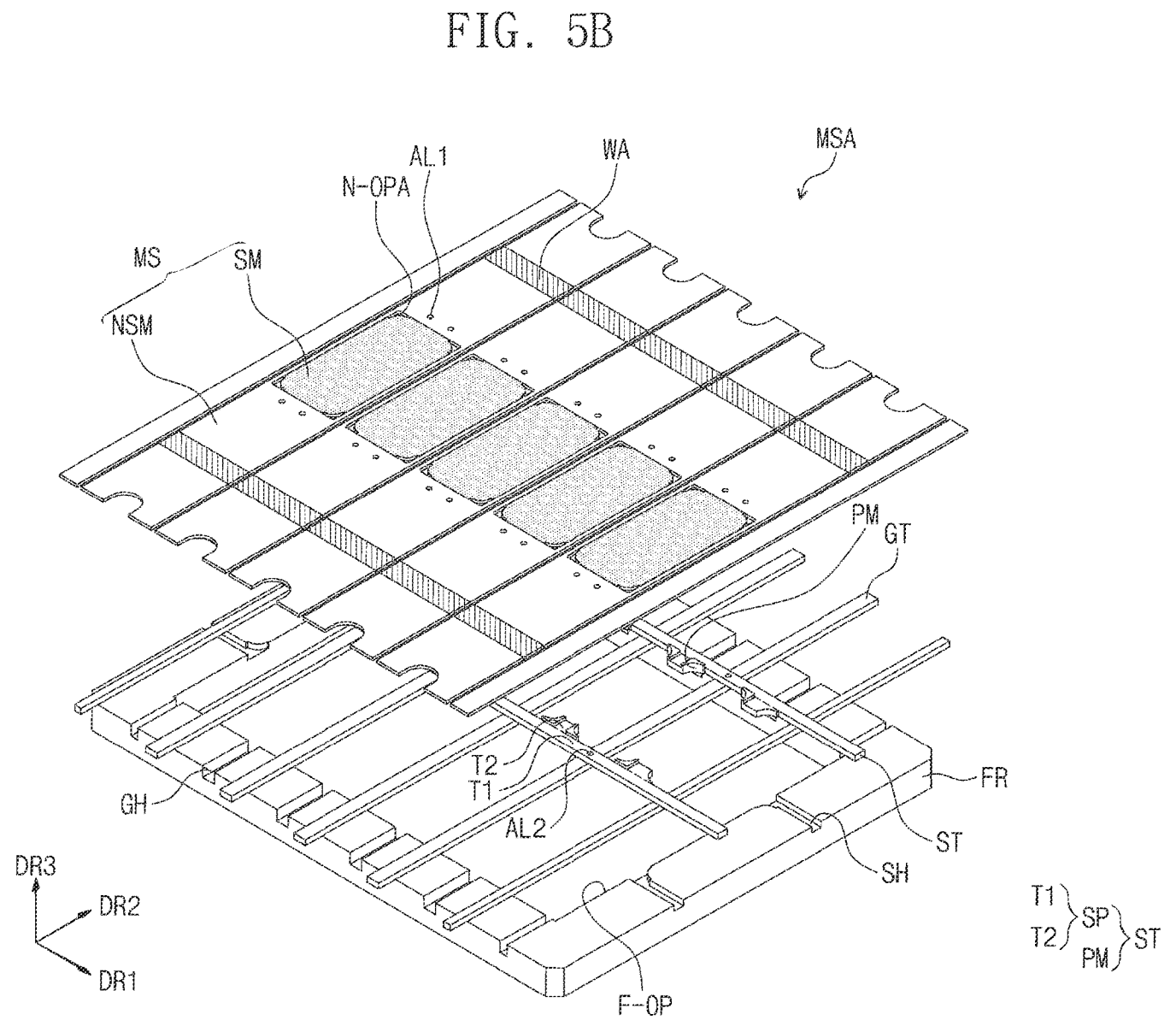
Figure 6A:
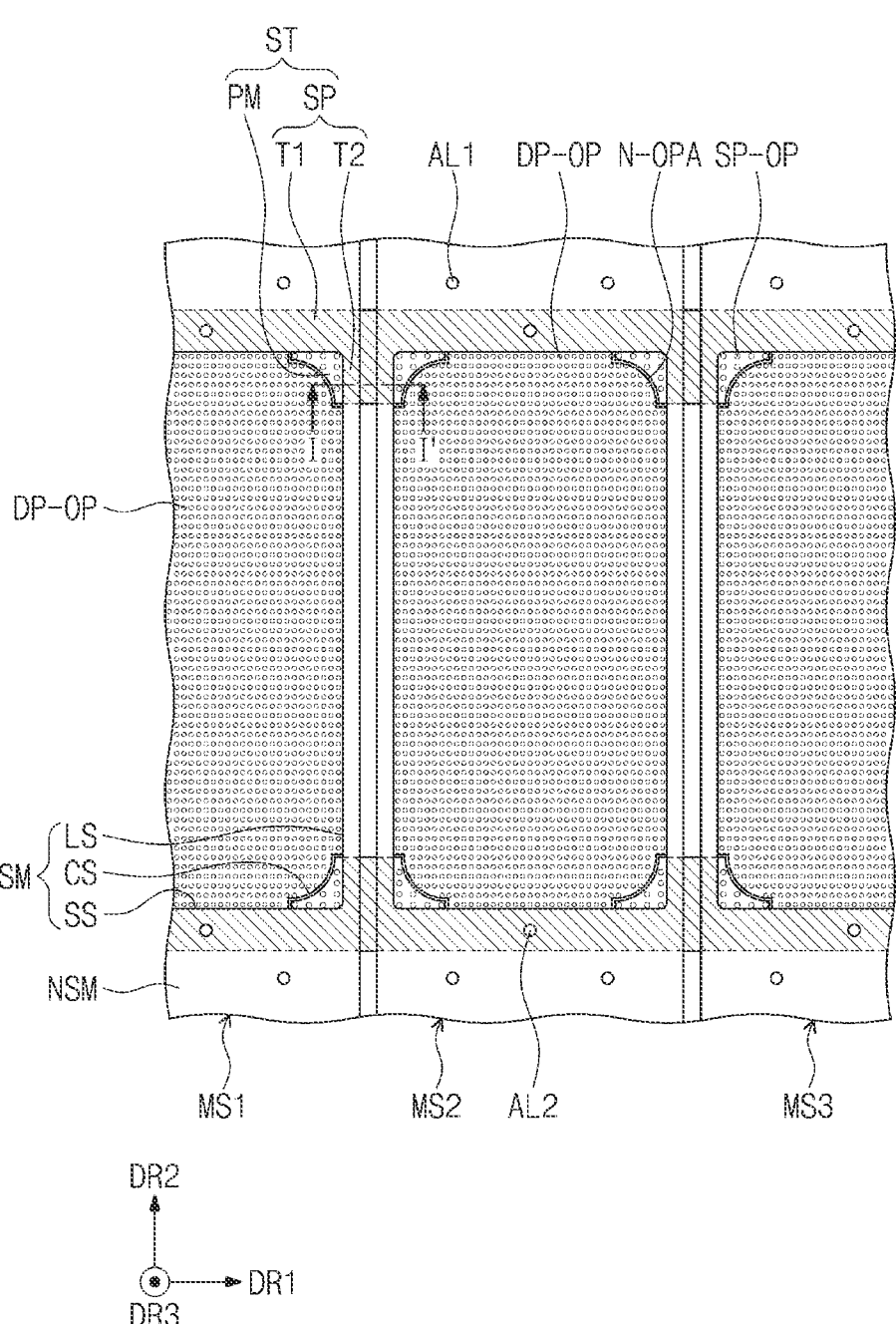
FIG. 6A is a schematic enlarged plan view illustrating an area of the mask assembly according to an embodiment.
Figure 6B:
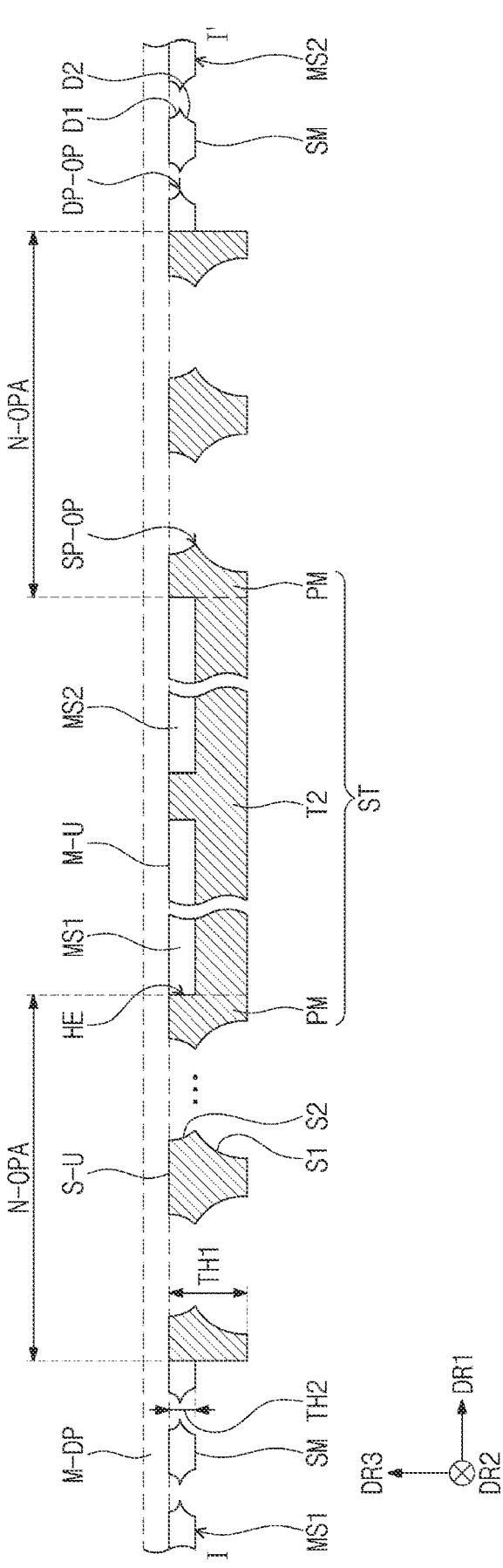
FIG. 6B is a schematic cross-sectional view taken along line I-I' of FIG. 6A.

FIG. 5A is a schematic coupling perspective view of a mask assembly according to an embodiment. FIG. 5B is a schematic exploded perspective view of the mask assembly according to an embodiment. FIG. 6A is a schematic enlarged plan view illustrating an area of the mask assembly according to an embodiment. FIG. 6B is a schematic cross-sectional view taken along line I-I' of FIG. 6A. The same and/or similar reference numerals are used for the same/similar configurations as the configurations described in FIGS. 1 to 3C, and redundant descriptions are omitted for descriptive convenience.

Referring to FIGS. 5A and 5B, a mask assembly MSA according to an embodiment may include a frame FR, a mask MS, a stick ST, and a gap stick GT. According to an embodiment, the gap stick GT may be disposed on the frame FR, the stick ST may be disposed on the gap stick GT, and the mask MS may be disposed on the stick ST.

The frame FR may support (or fix) the mask MS, which is provided in plural. A frame opening F-OP may be formed in the frame FR. A deposition material ejected (or injected) from a deposition source DS during a deposition process through the deposition apparatus EDA (see FIG. 1) may pass through the frame opening F-OP so as to be transferred to the mask MS. The frame FR of the mask assembly MSA may be disposed closest to the deposition source DS (see FIG. 1) among the parts or elements of the mask assembly MSA.

A first groove SH, in which the stick ST may be disposed, and a second groove GH, in which the gap stick GT may be disposed, may be formed in the frame FR. Each of the first grooves SH and the second grooves GH may be formed by removing a portion of the frame FR from a top surface (or an upper surface) toward a rear surface (or a lower surface) of the frame FR. The first groove SH and the second groove GH may be formed in portions of the frame FR, which are perpendicular to each other.

In an embodiment, a depth of the second groove GH may be equal to or greater than the sum of thicknesses of the stick ST and the gap stick GT. Thus, in case that the gap stick GT may be disposed first in the second groove GH, and the gap stick GT may be disposed in the first groove SH, a height difference due to the thicknesses of the stick ST and the gap stick GT may be offset. Thus, the deposition substrate M-OP (see FIG. 1) may be disposed in a flat state on the mask MS, and the mask assembly MSA having improved accuracy of the deposition process may be provided.

The mask MS may be disposed on the frame FR. The mask MS may be provided in plural, which are arranged to be spaced apart from each other in the first direction DR1, and each of the masks MS may extend in the second direction DR2. Hereinafter, description will be made based on a mask MS, and the description thereof may be applied to the masks.

The mask MS may include a deposition part SM and a non-deposition part NSM disposed outside (or adjacent to) the deposition part SM. The deposition part SM may include main deposition openings DP-OP that are penetrated in a direction from a top surface (or an upper surface) of the mask MS toward a rear surface (or a lower surface) of the mask MS. The deposition material ejected (or injected) from the deposition source DS (see FIG. 1) may be deposited on the deposition substrate M-OP (see FIG. 1) through the main deposition openings DP-OP. In an embodiment, the mask MS may include an invar.

The deposition part SM may include a short side SS extending in the first direction DR1, a long side LS extending in the second direction DR2, and a corner CS disposed between the short side SS and the long side LS to connect the short side SS to the long side LS. The corner CS may have a curvature (e.g., as predetermined).

A non-deposition part NSM may be disposed outside (or adjacent to) the deposition part SM. For example, a portion of the non-deposition part NSM may define a boundary with the deposition part SM and extend from the deposition part SM, and a remaining portion of the non-deposition part NSM may be spaced a space (e.g., as predetermined) from the deposition part SM.

A first alignment hole AL1 may be formed in the non-deposition part NSM. After the mask MS is aligned at a set position on the frame FR through the first alignment hole AL1, a welding process may be performed on a welding area WA to couple the mask MS to the frame FR. A portion protruding to the outside of the frame FR based on the welding area WA may be removed from the mask MS before the deposition process is performed.

At least a portion of the first alignment hole AL1 may be formed by removing the top surface (or the upper surface) of the mask MS toward the rear surface (or the lower surface) of the mask MS. According to an embodiment, the first alignment hole AU may be provided in plural, which are arranged to be spaced apart from each other in the first direction DR1. In a plan view, the first alignment holes AL1 may not overlap the stick ST or may be offset from the stick ST.

According to an embodiment, in the mask MS, a space spaced apart from the deposition part SM and the non-deposition part NSM may be defined as a coupling opening N-OPA. The coupling opening N-OPA may be formed to pass from the top surface (or the upper surface) of the mask MS toward the rear surface (or the lower surface) of the mask MS.

The coupling opening N-OPA may be a space in which a pattern part PM of the stick ST, which will be described below, is disposed. The coupling opening N-OPA may be provided in plural. In an embodiment, the coupling opening N-OPA may be formed between the corner CS of the deposition part SM and the non-deposition part NSM facing the corner CS. In an embodiment, four coupling openings N-OPA may be formed in the mask MS, but any one of the coupling openings N-OPA may be omitted according to a deposition recipe and embodiments are not limited thereto.

The stick ST may be coupled to the first groove SH of the frame FR and may be disposed between the gap stick GT and the mask MS. The stick ST may be provided in plural, each of which extends in the first direction DR1, and the sticks ST may be spaced apart from each other in the second direction DR2. Thus, the sticks ST may support the masks MS so that the masks MS arranged in the first direction DR1 do not droop (or bent) downward of the frame FR.

The stick ST may be coupled to the frame FR after tensioning both ends (e.g., opposite ends) through a clamp and aligning the tensioned ends through the second alignment hole AL2.

In an embodiment, any one stick ST may be disposed to overlap any one short side SS of the mask MS and the adjacent non-deposition part NSM, and the other stick ST may be disposed to overlap the other short side SS of the mask MS and the adjacent non-deposition part NSM. Hereinafter, it will be described based on a stick ST.

A second alignment hole AL2 may be formed in the stick ST. The second alignment hole AL2 may be formed by removing at least a portion of the second alignment hole AL2 from the top surface (or the upper surface) of the stick ST toward the rear surface (or the lower surface) of the stick ST. After the stick ST is aligned at a set position on the frame FR through the second alignment hole AL2, the stick ST and the frame FR may be coupled to each other. For example, the second alignment hole AL2 may be formed in a portion of the stick ST facing a center portion of the short side SS of the deposition part SM, e.g., in the second direction DR2. For example, the second alignment hole AL2 may be formed in the portion of the stick ST corresponding to a center of the width of the stick ST, e.g., in the second direction DR2.

In an embodiment, the stick ST may include a support part SP and a pattern part PM protruding from the support part SP. The support part SP may include a first portion T1 extending in the first direction DR1 and a second portion T2 extending from the first portion T1 in the second direction DR2. The stick ST may be made of stainless steel.

The first portion T1 may overlap the non-deposition part NSM of each of the masks MS arranged in the first direction DR1. For example, the first portion T1 may overlap the non-deposition part NSM adjacent to the short side SS of the deposition part SM on the non-deposition parts NSM. Both ends (e.g., opposite ends) of the first portion T1 may be disposed in the first groove SH of the frame FR.

The second portion T2 may overlap the non-deposition part NSM of each of the adjacent masks MS. For example, the second portion T2 may overlap the non-deposition part NSM adjacent to the long side LS of the deposition part SM on the non-deposition parts NSM.

In an embodiment, the pattern part PM may protrude from the first portion T1 and the second portion T2 and overlap the coupling opening N-OPA of the mask MS. For example, the pattern part PM of the stick ST may have a shape corresponding to a shape of the coupling opening N-OPA of the mask MS, e.g., in a plan view. For example, the pattern part PM of the stick ST and the coupling opening N-OPA of the mask MS may have a substantially same shape as each other, e.g., in a plan view.

An arrangement relationship between the mask MS and the stick ST will be described in detail with reference to FIGS. 6A and 6B. FIG. 6A is a schematic enlarged view illustrating portions of the masks MS1, MS2, and MS3 and the stick ST in a state in which the mask assembly MSA is coupled, and the remaining components are omitted.

The pattern part PM may be disposed in the coupling opening N-OPA formed in each of the masks MS1, MS2, and MS3. Thus, the pattern part PM may be disposed between the corner CS of the deposition part SM and the non-deposition part NSM. According to an embodiment, the pattern part PM of the stick ST may include sub deposition openings SP-OP passing from the top surface (or the upper surface) of the stick ST toward the rear surface (or the lower surface) of the stick ST. In an embodiment, a surface area of each of the sub deposition openings SP-OP may be different from that of each of the main deposition openings DP-OP.

Referring to FIG. 6B, according to an embodiment, the surface area of each of the main deposition openings DP-OP may be less than that of each of the sub deposition openings SP-OP. The surface area of each of the deposition openings may correspond to an area on which the deposition material is deposited on the deposition substrate M-DP (see FIG. 1).

An inner surface of the deposition part SM defining each of the main deposition openings DP-OP may include a first curved surface D1 and a second curved surface D2. The first curved surface D1 may be connected to a top surface (or an upper surface) of the deposition part SM, and the second curved surface D2 may be disposed between a rear surface (or a lower surface) of the deposition part SM and the first curved surface D1. An internal angle between the first curved surface D1 and the second curved surface D2 may be an acute angle.

An inner surface of the pattern part PM defining each of the sub-deposition openings SP-OP may include a first curved surface S1 and a second curved surface S2. The first curved surface 51 may be connected to a top surface (or an upper surface) of the pattern part PM, and the second curved surface S2 may be disposed between a rear surface (or a lower surface) of the pattern part PM and the first curved surface S1. An internal angle between the first curved surface S1 and the second curved surface S2 may be an acute angle.

The masks MS1 and MS2 and the stick ST may define the same plane in the coupled state. For example, a top surface (or an upper surface) M-U of each of the masks MS1 and MS2 may define the same plane as a top surface (or an upper surface) S-U of the stick ST. For example, the top surface M-U of each of the masks MS1 and MS2 and the top surface S-U of the stick ST may be coplanar. A deposition substrate M-DP (as denoted by a dotted line) may be disposed on the top surface MU of each of the masks MS1 and MS2 and the top surface S-U of the stick ST, and the deposition substrate M-OP may be disposed on a flat surface of the mask assembly MSA.

According to an embodiment, a half-etched portion HE may be formed by removing a portion of the support part SP of the stick ST from the top surface S-U of the stick ST toward the rear surface (or the lower surface) of the stick ST so that the top surface MU of each of the masks MS1 and MS2 and the top surface S-U of the stick ST form a flat surface.

The support part SP of the stick ST may correspond to the half-etched portion HE, and the pattern part PM may be an area that is not removed. Therefore, the pattern part PM may be coupled to the coupling opening N-OPA formed in the mask MS and disposed inside a portion of the stick ST, which is removed. Thus, the top surface S-U of the stick ST defining the same plane as the top surface M-U of the mask MS-A may be substantially the top surface of the pattern part PM.

A thickness of the portion removed from the stick ST may be equal to or greater than a minimum thickness of the mask MS. A thickness TH2 of the stick ST may be about 50 μm or more and about 150 μm or less. For example, the thickness of the stick ST may be a thickness of the pattern part PM in which the half-etched portion HE is not provided. A thickness HT2 of the mask MS may be about 10 μm or more and about 30 μm or less.

The mask assembly MSA described with reference to FIGS. 5A to 6B may be used to deposit the emission patterns provided in the display panel DP of the display device DD, which is described with reference to FIGS. 3A to 3C.

The shape and surface area of each of the main emission areas PXA-RM, PXA-GM described with reference to FIG. 3C, and PXA-BM and the sub emission areas PXA-RS, PXA-GS, and PXA-BS may correspond to those of the emission patterns deposited through the mask assembly MSA.

As described with reference to FIGS. 3A to 3C, the emission patterns disposed on the second display area DA2 of the display panel DP may be patterned to have different areas (e.g., shapes or sizes) from the emission patterns disposed on the first display area DA1. Thus, openings having different areas (e.g., shapes or sizes) should be formed so that the emission patterns of the display panel DP including the second display area DA2 and the first display area DA1 are deposited.

The mask assembly MSA according to an embodiment may be used to deposit the emission patterns to be disposed on the first display area DA1 (e.g., main deposition area) through the main deposition openings DP-OP formed in the deposition part SM of the mask MS and deposit the emission patterns to be disposed on the first to fourth corner display areas DA2_C1 to DA2_C4 (e.g., sub deposition areas) on the second display area DA1 through the sub deposition openings SP-OP formed in the pattern part PM of the stick ST.

For example, the emission patterns disposed on the main emission areas PXA-RM, PXA-GM, and PXA-BM, which are described in FIG. 3C, may be deposited by the corresponding main deposition openings DP-OP, and the emission patterns disposed on the sub-emission areas PXA-RS, PXA-GS, and PXA-BS may be deposited by the sub deposition openings SP-OP.

According to the disclosure, the deposition openings having the different areas (e.g., shapes or sizes) may be formed in the mask MS and the stick ST, and the mask MS and the stick ST may be coupled to each other to provide the flat surface, on which the deposition substrate M-DP is disposed, so that the different types of light emitting patterns deposited on the different areas are easily deposited. For example, the mask patterning process for forming the openings having the different areas (e.g., shapes or sizes) in a mask may be omitted.

Figure 7A:
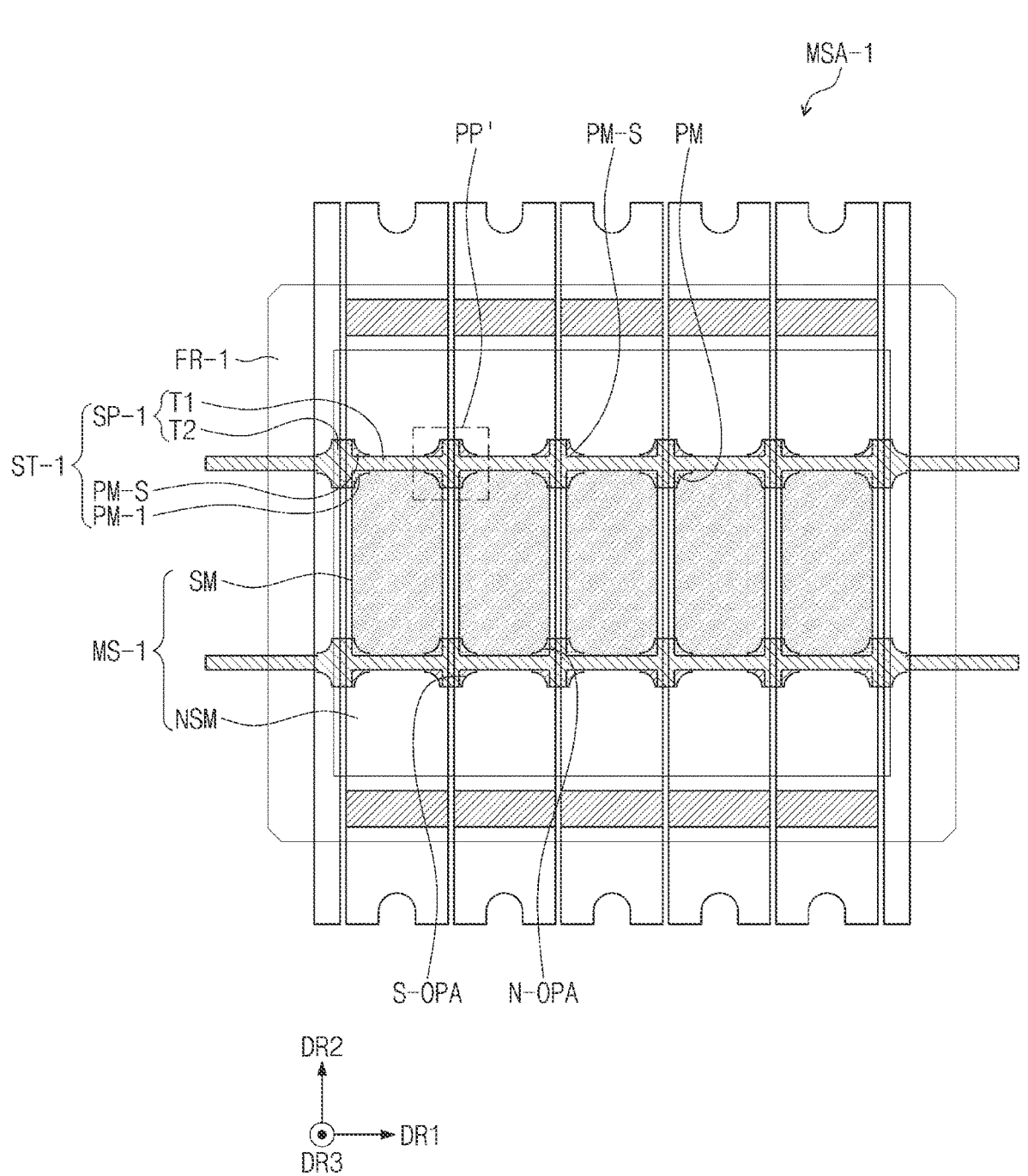
FIG. 7A is a schematic plan view of the mask assembly according to an embodiment.
Figure 7B:
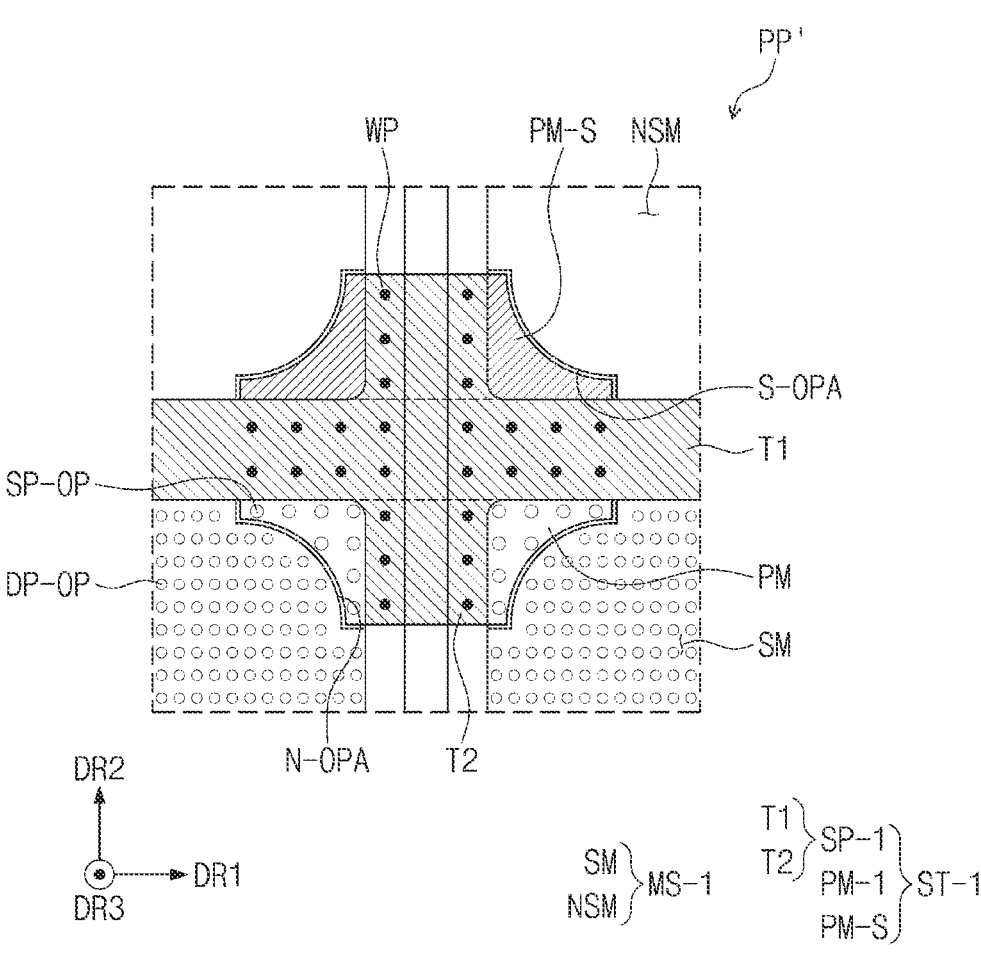
FIG. 7B is a schematic enlarged plan view of an area PP' of FIG. 7A.

FIG. 7A is a schematic plan view of the mask assembly according to an embodiment. FIG. 7B is a schematic enlarged plan view of an area PP' of FIG. 7A. The same/similar reference numerals are used for the same components as those of FIGS. 1 to 6B, and thus, the redundant descriptions will be omitted for descriptive convenience.

Referring to FIGS. 7A and 7B, a mask assembly MSA-1 according to an embodiment may include a frame FR-1, a stick ST-1, and a mask MS-1. The frame FR-1 may correspond to the frame FR described with reference to FIG. 5A.

The stick ST-1 according to an embodiment may include a support part SP-1 including a first portion T1 and a second portion T2, a first pattern part PM-1, and a second pattern part PM-S.

The first portion T1 may overlap the non-deposition part NSM of each of the masks MS-1 arranged in the first direction DR1. The second portion T2 may overlap the non-deposition part NSM of each of the adjacent masks MS-1 (e.g., in a vertical direction or the third direction DR3).

In an embodiment, the first pattern part PM-1 may protrude from the first portion T1 and the second portion T2 (e.g., in a horizontal direction) and overlap the first coupling opening N-OPA of the mask MS-1 (e.g., in the vertical direction or the third direction DR3). Sub deposition openings SP-OP may be formed in the first pattern part PM-1.

The stick ST-1 according to an embodiment may further include a second pattern part PM-S that is symmetrical to the first pattern part PM-1 with respect to the first portion T1. The second pattern part PM-S may protrude from the first portion T1 and the second portion T2 (e.g., in the first and/or second direction DR1 and/or DR2) and overlap the non-deposition part NSM of the mask MS (e.g., in the third direction DR3). Unlike the first pattern part PM-1, openings may not be formed in the second pattern part PM-S.

Referring to FIG. 7B, at least a portion of each of the first portion T1 and the second portion T2 of the stick ST-1 may be removed from the top surface of the stick ST-1 toward the rear surface (or the lower surface) of the stick ST-1, like the half-etched portion HE described with reference to FIG. 7B.

The first pattern part PM-1 of the stick ST-1 may be disposed in the first coupling opening N-OPA, and a top surface (or an upper surface) of the first pattern part PM-1 and a top surface (or an upper surface) of the mask MS-1 may provide (or form) a flat surface on which the deposition substrate M-DP is disposed.

The second pattern part PM-2 of the stick ST-1 may be disposed in the second coupling opening S-OPA, and a top surface (or an upper surface) of the second pattern part PM-S and a top surface (or an upper surface) of the mask MS-1 may define the same plane and provide (or form) a flat surface on which the deposition substrate M-DP (see FIG. 1) is disposed.

In an embodiment, the mask MS-1 may include a deposition part SM and a non-deposition part NSM. Main deposition openings DP-OP may be formed in the deposition part SM. A surface area (or surface size) of each of the main deposition openings DP-OP may be less than that of each of the sub deposition openings SP-OP.

A first coupling opening N-OPA may be formed between the deposition part SM and the non-deposition part NSM. The first pattern part PM-1 of the stick ST-1 may be disposed in the first coupling opening N-OPA.

In an embodiment, a second coupling opening S-OPA may be formed in the non-deposition part NSM. A second pattern part PM-S may be disposed in the second coupling opening S-OPA.

According to an embodiment, the stick ST-1 may include a first pattern part PM-1 and a second pattern part PM, which are symmetrical to each other with respect to the first direction DR1 that is an extension direction of the support part SP-1. Thus, a phenomenon in which tensile stress is concentrated in a specific area may be prevented from occurring in case that the stick ST-1 is tensioned.

According to an embodiment, a welding protrusion WP disposed on the mask MS-1 may be further provided. The welding protrusion WP may be disposed on an area overlapping the stick ST-1 on the non-deposition parts NSM of the mask MS-1. The welding protrusion WP may be provided by coupling the mask MS-1 to the stick ST-1 through a welding process. The position and number of welding protrusions WP are not limited to any one embodiment as long as the welding protrusions overlap the stick ST-1 on the non-deposition part NSM.

Figure 8A:
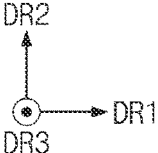
FIG. 8A is a schematic plan view of a mask assembly according to an embodiment.
Figure 8B:
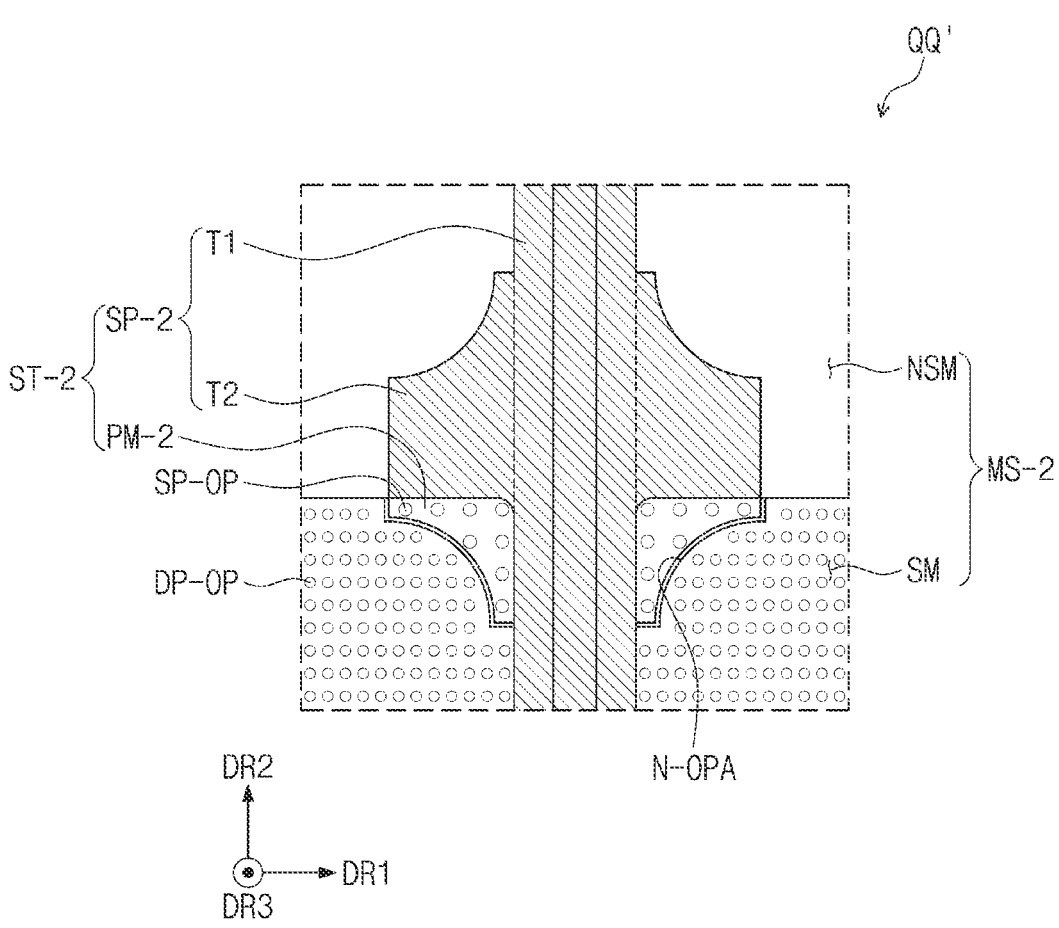
FIG. 8B is a schematic enlarged plan view of an area QQ' of FIG. 8A.

FIG. 8A is a schematic plan view of a mask assembly according to an embodiment. FIG. 8B is a schematic enlarged plan view of an area QQ' of FIG. 8A. The same/ similar reference numerals are used for the same components as those of FIGS. 1 to 6B, and thus, the redundant descriptions will be omitted for descriptive convenience.

Referring to FIGS. 8A and 8B, a mask assembly MSA-2 according to an embodiment may include a frame FR-2, a stick ST-2, and a mask MS-2. The frame FR-2 may correspond to the frame FR described with reference to FIG. 5A.

The stick ST-2 according to an embodiment may include a support part SP-2 including a first portion T1 and a second portion T2 and a pattern part PM-2.

In an embodiment, the first portion T1 may extend in the second direction DR2 and may be disposed between adjacent masks MS-2. For example, the first portion T1 may overlap the non-deposition part NSM of each of the two adjacent masks MS-2 (e.g., in a plan view).

The second portion T2 may extend from the first portion T1 in the first direction DR1. The second portion T2 may overlap the non-deposition part NSM (e.g., in a plan view).

In an embodiment, the pattern part PM-2 may protrude from the first portion T1 and the second portion T2 and overlap the coupling opening N-OPA of the mask MS-2. Sub deposition openings SP-OP may be formed in the pattern part PM-2.

Referring to FIG. 8B, at least a portion of each of the first portion T1 and the second portion T2 of the stick ST-2 may be removed from the top surface of the stick ST-2 toward the rear surface (or the lower surface) of the stick ST-2, like the half-etched portion HE described with reference to FIG. 7B. A portion corresponding to a half-etched portion HE of the stick ST-2 is illustrated by hatching.

The pattern part PM-2 of the stick ST-1 may be disposed in a coupling opening S-OPA, and a top surface (or an upper surface) of the pattern part PM-2 and a top surface (or an upper surface) of the mask MS-2 may define the same plane and provide a flat surface on which the deposition substrate M-DP (see FIG. 1) is disposed.

In an embodiment, the mask MS-2 may include a deposition part SM and a non-deposition part NSM. Main deposition openings DP-OP may be formed in the deposition part SM. A surface area (or surface size) of each of the main deposition openings DP-OP may be less than that of each of the sub deposition openings SP-OP.

A coupling opening N-OPA may be formed between the deposition part SM and the non-deposition part NSM. A pattern part PM-2 of the stick ST-2 may be disposed in the coupling opening N-OPA.

According to an embodiment, the stick ST extending in the second direction DR2 described with reference to FIG. 5B may be omitted, and since the pattern part MP-2 is disposed on the stick ST-2 disposed between the masks MS-2, a process of aligning and fixing the stick ST of FIG. 5B may be omitted, and also, a process of forming a first groove SH (see FIG. 1) in the frame FR-2 may be omitted.

Figure 9B:
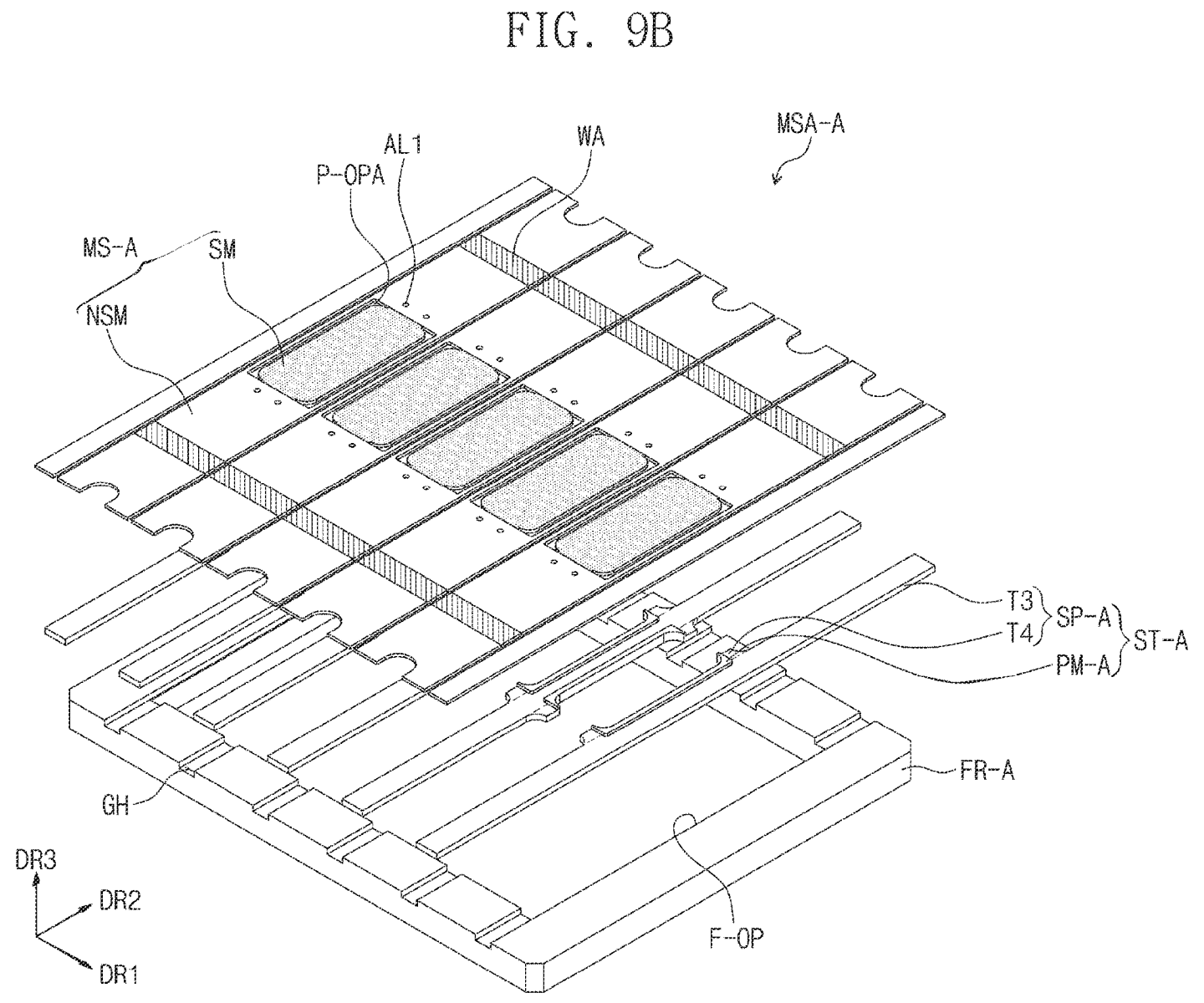
Figure 10A:
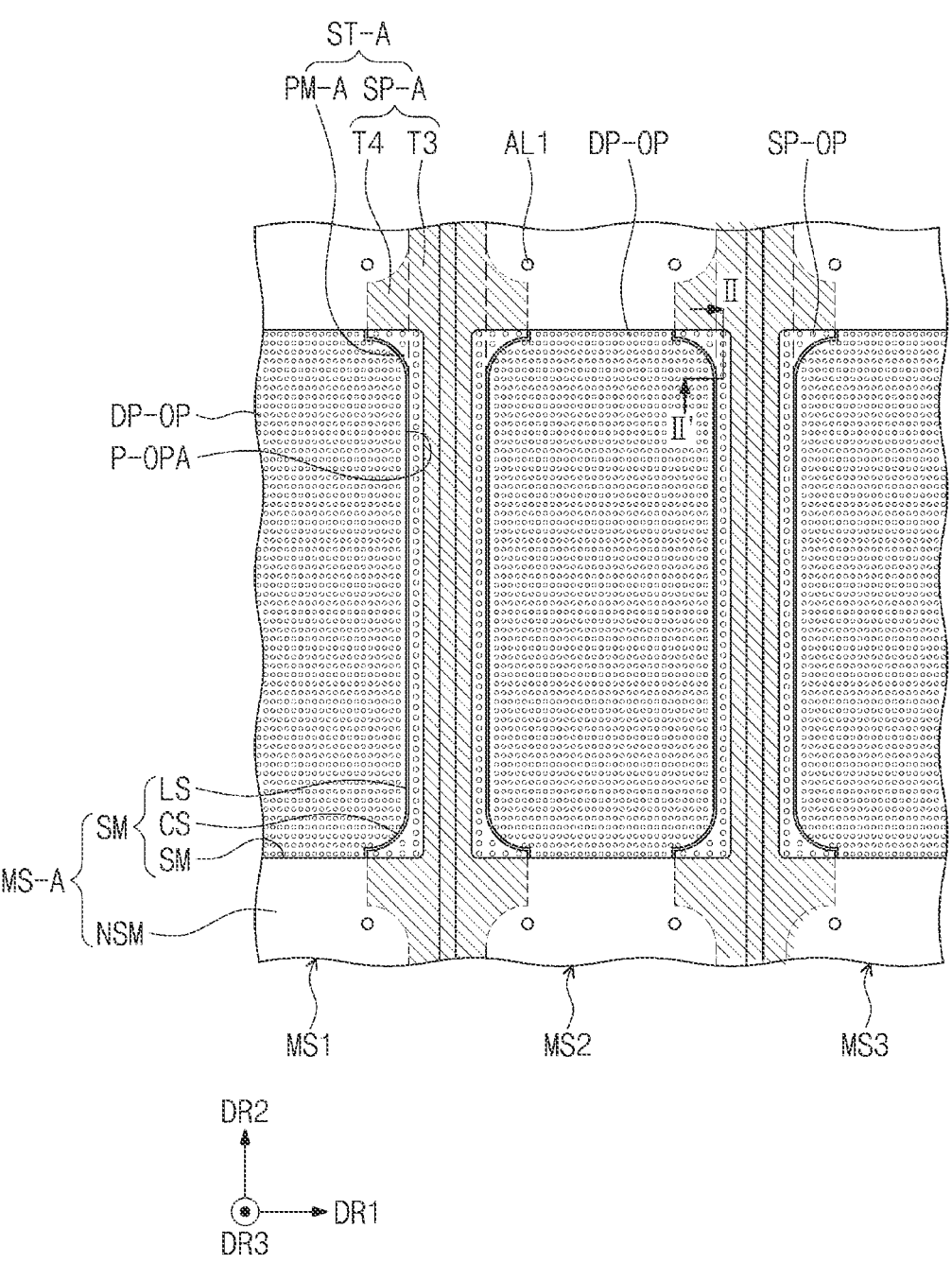
FIG. 10A is a schematic enlarged plan view illustrating an area of the mask assembly according to an embodiment.
Figure 10B:
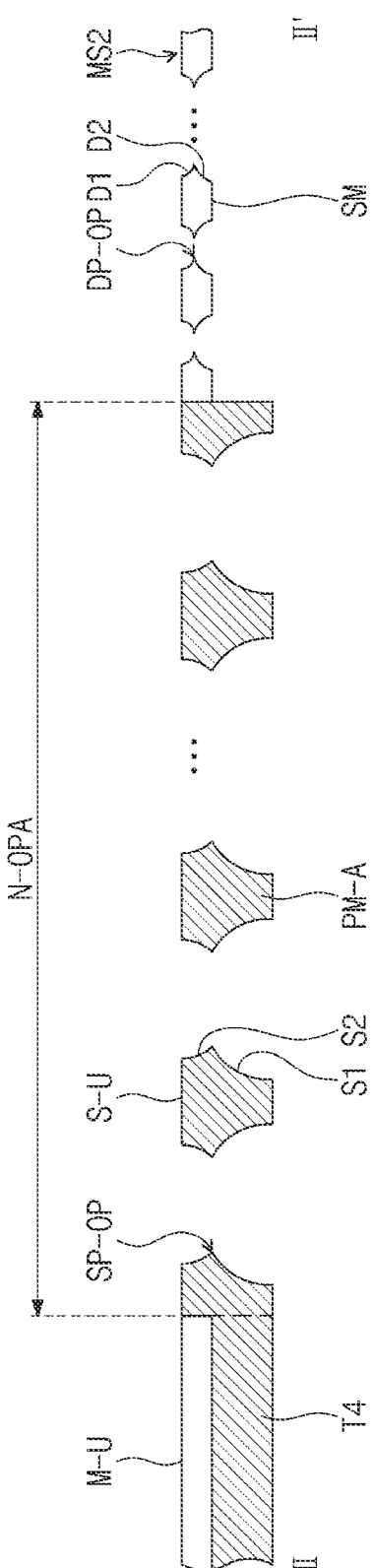
FIG. 10B is a schematic cross-sectional view taken along line II-IF of FIG. 10A.

FIG. 9A is a schematic coupling perspective view of a mask assembly according to an embodiment. FIG. 9B is a schematic exploded perspective view of the mask assembly according to an embodiment. FIG. 10A is a schematic enlarged plan view illustrating an area of the mask assembly according to an embodiment. FIG. 10B is a schematic cross-sectional view taken along line II-IF of FIG. 10A. The same/similar reference numerals are used for the same components as those of FIGS. 1 to 6B, and thus, the redundant descriptions will be omitted for descriptive convenience.

Referring to FIGS. 9A and 9B, a mask assembly MSA-A according to an embodiment may include a frame FR-A, a mask MS-A, and a stick ST-A. According to an embodiment, the stick ST-A may be disposed on the frame FR-A, and the mask MS-A may be disposed on the stick ST-A.

The frame FR-A may support masks MS-A. A frame opening F-OP may be formed in the frame FR-A. A deposition material ejected (or injected) from a deposition source DS during a deposition process through the deposition apparatus EDA (see FIG. 1) may pass through the frame opening F-OP so as to be transferred to the mask MS-A. The frame FR-A of the mask assembly MSA-A may be disposed closest to the deposition source DS (see FIG. 1).

A groove GH in which the stick ST-A may be disposed may be formed in the frame FR-A. The groove GH may be formed by removing a portion of the frame FR-A from a top surface (or an upper surface) toward a rear surface (or a lower surface) of the frame FR-A.

In an embodiment, the mask MS-A may be disposed on the frame FR-A. The mask MS-A may be provided in plural, which are arranged to be spaced apart from each other in the first direction DR1, and each of the masks MS may extend in the second direction DR2. Hereinafter, description will be made based on a mask MS-A, and the description thereof may be applied to the plurality of masks.

The mask MS-A may include a deposition part SM and a non-deposition part NSM disposed outside (or adjacent to) the deposition part SM. The deposition part SM may include main deposition openings DP-OP that are penetrated in a direction from a top surface (or an upper surface) of the mask MS-A toward a rear surface (or the lower surface) of the mask MS-A. The deposition material ejected (or injected) from the deposition source DS (see FIG. 1) may be deposited on the deposition substrate M-OP (see FIG. 1) through the main deposition openings DP-OP. In an embodiment, the mask MS-A may include an invar.

The deposition part SM may include a short side SS extending in the first direction DR1, a long side LS extending in the second direction DR2, and a corner CS disposed between the short side SS and the long side LS to connect the short side SS to the long side LS. The corner CS may have a curvature (e.g., as predetermined).

A non-deposition part NSM may be disposed outside (or adjacent to) the deposition part SM. For example, a portion of the non-deposition part NSM may define a boundary with the deposition part SM and extend from the deposition part SM, and a remaining portion of the non-deposition part NSM may be spaced a space (e.g., as predetermined) from the deposition part SM.

A first alignment hole AU may be formed in the non-deposition part NSM. After the mask MS-A is aligned at a set position on the frame FR-A through the first alignment hole AL1, a welding process may be performed on a welding area WA to couple the mask MS-A to the frame FR-A. A portion protruding to the outside of the frame FR-A based on the welding area WA may be removed from the mask MS-A before the deposition process is performed At least a portion of the first alignment hole AL1 may be formed to be removed from the top surface of the mask MS-A toward the rear surface (or the lower surface) of the mask MS-A. According to an embodiment, the first alignment hole AL1 may be provided in plural, which are arranged to be spaced apart from each other in the first direction DR1. In a plan view, the first alignment holes AL1 may not overlap the stick ST-A or may be offset from the stick ST-A.

According to an embodiment, in the mask MS-A, a space spaced apart from the deposition part SM and the non-deposition part NSM may be defined as a coupling opening P-OPA. The coupling opening P-OPA may be formed to pass from the top surface of the mask MS-A toward the rear surface (or the lower surface) of the mask MS-A.

The coupling opening P-OPA may be a space in which a pattern part PM-A of the stick ST-A, which will be described below, is disposed. The coupling opening P-OPA may be provided in plural. In an embodiment, the coupling opening P-OPA may be formed between a long side LS of the deposition part SM and the non-deposition part NSM facing the long side LS and between a corner CS and the non-deposition part NSM facing the corner CS.

In an embodiment, two coupling openings P-OPA may be formed in the mask MS, but any one of the coupling openings P-OPA may be omitted according to a deposition recipe and embodiments are not limited thereto.

The stick ST-A may be coupled to a first groove SH of the frame FR-A. The stick ST-A may be provided in plural, each of which extends in the second direction DR2, and the sticks ST-A may be spaced apart from each other in the first direction DR1. Thus, the sticks ST-A may be disposed between the two adjacent masks MS-A to support the masks MS-A so as not to droop (or bent) downward of the frame FR-A. The stick ST-A may be coupled to the frame FR-A after tensioning both ends (e.g., opposite ends) through a clamp.

In an embodiment, any one stick ST-A may be disposed to overlap any one lone side LS of the mask MS-A and the adjacent non-deposition part NSM, and the other stick ST-A may be disposed to overlap the other long side LS of the mask MS-A and the adjacent non-deposition part NSM. Hereinafter, it will be described based on a stick ST-A.

In an embodiment, the stick ST-A may include a support part SP-A and a pattern part PM protruding from the support part SP-A. The support part SP-A may include a first portion T3 extending in the second direction DR2 and a second portion T4 extending from the first portion T3 in the first direction DR1. The stick ST-A may be made of stainless steel.

The first portion T3 may overlap the non-deposition part NSM adjacent to the long side LS of the deposition part SM on the non-deposition parts NSM. Both ends (e.g., opposite ends) of the first portion T3 may be disposed in a groove GH of the frame FR-A.

The second portion T4 may overlap the non-deposition part NSM adjacent to the corner CS of the deposition part SM on the non-deposition parts NSM.

In an embodiment, the pattern part PM-A may protrude from the first portion T3 and the second portion T4 and may be adjacent to the long side LS and the corner CS of the deposition part SM. The pattern part PM-A may extend in the second direction DR2. The pattern part PM-A may overlap the coupling opening P-OPA of the mask MS-A.

An arrangement relationship between the mask MS-A and the stick ST-A will be described in detail with reference to FIGS. 10A and 10B. FIG. 10A is a schematic enlarged view illustrating portions of the masks MS1, MS2, and MS3 and the stick ST-A in a state in which the mask assembly MSA-A is coupled, and the remaining components are omitted.

The pattern part PM-A may be disposed in the coupling opening P-OPA formed in each of the masks MS1, MS2, and MS3. Thus, the pattern part PM-A may be disposed between the long side LS and the non-deposition part NSM of the deposition part SM and between the corner CS and the non-deposition part NSM of the deposition part SM. According to an embodiment, the pattern part PM-A of the stick ST-A may include sub deposition openings SP-OP passing from the top surface of the stick ST-A toward the rear surface (or the lower surface) of the stick ST-A. In an embodiment, a surface area (or surface size) of each of the sub deposition openings SP-OP may be different from that of each of the main deposition openings DP-OP.

Referring to FIG. 10B, according to an embodiment, the surface area (or surface size) of each of the main deposition openings DP-OP may be less than that of each of the sub deposition openings SP-OP. The surface area of each of the deposition openings may correspond to an area on which the deposition material is deposited on the deposition substrate M-DP (see FIG. 1).

An inner surface of the deposition part SM defining (or forming) each of the main deposition openings DP-OP may include a first curved surface D1 and a second curved surface D2. The first curved surface D1 may be connected to a top surface (or an upper surface) of the deposition part SM, and the second curved surface D2 may be disposed between a rear surface (or a lower surface) of the deposition part SM and the first curved surface D1. An internal angle between the first curved surface D1 and the second curved surface D2 may be an acute angle.

An inner surface of the pattern part PM-A defining (or forming) each of the sub-deposition openings SP-OP may include a first curved surface S1 and a second curved surface S2. The first curved surface S1 may be connected to a top surface (or an upper surface) of the pattern part PM-A, and the second curved surface S2 may be disposed between a rear surface (or a lower surface) of the pattern part PM-A and the first curved surface S1. An internal angle between the first curved surface S1 and the second curved surface S2 may be an acute angle.

The mask MS2 and the stick ST-A may define the same plane in the coupled state. For example, a top surface (or an upper surface) M-U of mask MS2 may define the same plane as a top surface (or an upper surface) S-U of the stick ST-A. The deposition substrate M-DP (see FIG. 1) may be disposed on each of the top surface MU of the mask MSA2 and the top surface S-U of the stick ST-A, and the deposition substrate M-OP may be disposed on a flat surface of the mask assembly MSA-A.

According to an embodiment, a portion (e.g., a half-etched portion HE in FIG. 6B) may be formed by removing a portion of the support part SP-A of the stick ST-A from the top surface S-U of the stick ST-A toward the rear surface (or the lower surface) of the stick ST-A so that the top surface MU of the mask MS2 and the top surface S-U of the stick ST-A form a flat surface.

The support part SP-A of the stick ST-A may be formed by removing a portion of the stick ST-A in a thickness direction, and the pattern part PM-A may be an area that is not removed. Thus, the pattern part PM-A may be coupled to a coupling opening P-OPA formed in the mask MS-A, and the non-deposition part NSM of the mask MS-A may be disposed at a portion formed by removing a portion of the stick ST-A. Thus, the top surface S-U of the stick ST-A defining the same plane as the top surface M-U of the mask MS-A may be substantially the top surface of the pattern part PM-A. For example, the top surface S-U of the stick ST-A and the top surface M-U of the mask MS-A may be coplanar.

A thickness of the portion removed from the stick ST-A may be equal to or greater than a minimum thickness of the mask MS-A.

The mask assembly MSA-A described with reference to FIGS. 9A to 10B may be used to deposit the emission patterns provided in the display panel DP of the display device DD-A, which is described with reference to FIGS. 4A to 4C.

The shape and surface area of each of the main emission areas PXA-RM, PXA-GM described with reference to FIG. 4C, and PXA-BM and the sub emission areas PXA-RS, PXA-GS, and PXA-BS may correspond to those of the emission patterns deposited through the mask assembly MSA-A.

As described with reference to FIGS. 4A to 4C, the emission patterns disposed on the second display area DA2 of the display panel DP may be patterned to have different areas (e.g., shapes or sizes) from the emission patterns disposed on the first display area DA1. Thus, openings having different areas (e.g., shapes or sizes) should be formed so that the emission patterns of the display panel DP including the second display area DA2 and the first display area DA1 are deposited.

The mask assembly MSA-A according to an embodiment may be used to deposit the emission patterns to be disposed on the first display area DA1 (e.g., main deposition area) through the main deposition openings DP-OP formed in the deposition part SM of the mask MS-A and deposit the emission patterns to be disposed on the second display area DA2 (e.g., sub deposition area) through the sub deposition openings SP-OP formed in the pattern part PM-A of the stick ST-A.

For example, the emission patterns disposed on the main emission areas PXA-RM, PXA-GM, and PXA-BM, which are described in FIG. 4C, may be deposited by the corresponding main deposition openings DP-OP, and the emission patterns disposed on the sub-emission areas PXA-RS, PXA-GS, and PXA-BS may be deposited by the sub deposition openings SP-OP.

According to the disclosure, the deposition openings having the different areas (e.g., shapes or sizes) may be formed in the mask MS-A and the stick ST-A, and the mask MS-A and the stick ST-A may be coupled to each other to provide the flat surface, on which the deposition substrate M-DP is disposed, so that the different types of light emitting patterns deposited on the different areas are easily deposited. The mask patterning process for forming the openings having the different areas in a mask may be omitted.

According to the disclosure, the openings having the different areas (e.g., shapes or sizes) may be formed in the mask and the stick, and the mask and the stick may be coupled to each other to provide the flat surface, on which the deposition substrate is disposed, so that the different types of emission patterns deposited on the different areas are easily deposited. The mask patterning process for forming the openings having the different areas (e.g., shapes or sizes) in a mask may be omitted.

It will be apparent to those skilled in the art that various modifications and deviations can be made in the embodiments. Thus, it is intended that the embodiments cover the modifications and deviations of this invention provided they come within the scope of the appended claims and their equivalents.

Accordingly, the technical scope of the invention should not be limited to the contents described in the detailed description of the specification, but should be determined by the claims.

What is claimed is:

1. A mask assembly comprising:
a frame including a frame opening;
a mask disposed on the frame, the mask comprising:
a deposition part including main deposition openings overlapping to the frame opening;
a non-deposition part adjacent to the deposition part; and
a coupling opening disposed between the deposition part and the non-deposition part; and
a stick comprising:
a support part overlapping the non-deposition part; and
a pattern part overlapping the coupling opening, the pattern part protruding from the support part and including sub deposition openings, wherein
the stick is disposed between the mask and the frame.

2. The mask assembly of claim 1, wherein a surface area of each of the sub deposition openings is greater than a surface area of each of the main deposition openings.

3. The mask assembly of claim 1, wherein
a portion of the support part is removed from an upper surface of the stick toward a lower surface of the stick,
a thickness of the portion of the support part that is removed from the upper surface of the stick toward the lower surface of the stick is equal to or greater than a minimum thickness of the mask,
the mask has a thickness range of about 10 μm to about 30 μm, and
the stick has a thickness range of about 40 μm to about 150 μm.

4. The mask assembly of claim 1, wherein
the coupling opening is adjacent to an edge of the deposition part.

5. The mask assembly of claim 1, wherein
the deposition part comprises:
a short side extending in a first direction;
a long side extending from the short side in a second direction intersecting the first direction; and
a corner connecting the short side to the long side, and
the coupling opening is disposed between the non-deposition part and the long side and between the non-deposition part and the corner.

6. The mask assembly of claim 1, wherein
an inner surface of the deposition part forming each of the main deposition openings, comprises:
a first curved surface connected to an upper surface of the deposition part; and
a second curved surface disposed between the first curved surface and a lower surface of the deposition part.

7. The mask assembly of claim 1, wherein
an inner surface of the pattern part forming each of the sub deposition openings, comprises:
a third curved surface connected to an upper surface of the pattern part; and
a fourth curved surface disposed between the third curved surface and a lower surface of the pattern part.

8. The mask assembly of claim 1, wherein
the deposition part comprises:
a short side extending in a first direction;
a long side extending from the short side in a second direction intersecting the first direction; and
a corner connecting the short side to the long side, and the stick extends in the first direction and is spaced apart from another stick in the second direction to overlap the non-deposition part adjacent to the short side.

9. The mask assembly of claim 8, further comprising a gap stick disposed between the stick and the frame, extending in the second direction, and spaced apart from another gap stick in the first direction to overlap the non-deposition part adjacent to the long side.

10. The mask assembly of claim 9, wherein a first groove, in which the stick is disposed, and a second groove, in which the gap stick is disposed, are formed in the frame, and the second groove has a depth that is equal to a sum of a thickness of the stick and a thickness of the gap stick.

11. The mask assembly of claim 1, wherein the mask comprises an invar, and the stick is made of stainless steel.

12. The mask assembly of claim 1, wherein the mask comprises a first alignment hole which does not overlap the stick.

13. The mask assembly of claim 1, wherein the deposition part comprises:

a short side extending in a first direction;

a long side extending from the short side in a second direction intersecting the first direction; and a corner connecting the short side to the long side, and the stick comprises a second alignment hole facing a center portion of the short side when viewed in the second direction.

14. The mask assembly of claim 1, wherein the pattern part comprises:

a first pattern part disposed at a side of the support part to overlap the coupling opening; and a second pattern part disposed at another side to overlap the non-deposition part, and the non-deposition part further comprises an additional coupling opening overlapping the second pattern part.

15. The mask assembly of claim 1, wherein the mask further comprises a welding protrusion adjacent to the pattern part and disposed on the support part.

16. A deposition apparatus comprising:

a deposition chamber;

a mask assembly inside the deposition chamber, the mask assembly comprising:

a frame including a frame opening;

a mask disposed on the frame; and a stick disposed between the mask and the frame;

a deposition substrate disposed on the mask assembly, the deposition substrate comprising:

a main deposition area; and a sub deposition area; and a deposition source that injects a deposition material into the frame opening, wherein the mask comprises:

a deposition part including main deposition openings overlapping the main deposition area;

a non-deposition part adjacent to the deposition part; and a coupling opening disposed between the deposition part and the non-deposition part, and the stick comprises:

a support part overlapping the non-deposition part; and a pattern part disposed in the coupling opening, the pattern part protruding from the support part and including sub deposition openings overlapping the sub deposition area.

17. The deposition apparatus of claim 16, wherein a surface area of each of the sub deposition openings is greater than a surface area of each of the main deposition openings.

18. The deposition apparatus of claim 17, wherein the coupling opening is adjacent to an edge of the deposition part.

19. The deposition apparatus of claim 17, wherein the deposition part comprises:

a short side extending in a first direction;

a long side extending from the short side in a second direction intersecting the first direction; and a corner connecting the short side to the long side, and the coupling opening is disposed between the non-deposition part and the long side and between the non-deposition part and the corner.

* * * * *